(12) United States Patent
Nagasawa et al.

(10) Patent No.: US 11,785,703 B2
(45) Date of Patent: Oct. 10, 2023

(54) SEMICONDUCTOR STORAGE DEVICE AND HEAT DISSIPATOR

(71) Applicant: Kioxia Corporation, Tokyo (JP)

(72) Inventors: Kazuya Nagasawa, Kamakura (JP); Tomoaki Morita, Ome (JP); Takahisa Funayama, Kawasaki (JP); Norihiro Ishii, Yokohama (JP); Hidenori Tanaka, Hachioji (JP)

(73) Assignee: Kioxia Corporation, Tokyo (JP)

( * ) Notice: Subject to any disclaimer, the term of this patent is extended or adjusted under 35 U.S.C. 154(b) by 48 days.

(21) Appl. No.: 17/473,093

(22) Filed: Sep. 13, 2021

(65) Prior Publication Data

US 2022/0304137 A1   Sep. 22, 2022

(30) Foreign Application Priority Data

Mar. 22, 2021   (JP) .................................. 2021-046831

(51) Int. Cl.
*H05K 1/02* (2006.01)
*H05K 1/18* (2006.01)

(52) U.S. Cl.
CPC .......... *H05K 1/0203* (2013.01); *H05K 1/181* (2013.01); *H05K 2201/10015* (2013.01); *H05K 2201/10159* (2013.01); *H05K 2201/10628* (2013.01); *H05K 2201/10901* (2013.01)

(58) Field of Classification Search
CPC ........ H05K 1/02; H05K 1/0203; H05K 1/181; H05K 1/188; H05K 2201/10015; H05K 2201/10159; H05K 2201/10628; H05K 2201/10901; H05K 2201/10969; H05K 7/20; G06F 1/187–189; G06F 1/203; (Continued)

(56) References Cited

U.S. PATENT DOCUMENTS

| 6,862,184 | B2 * | 3/2005 | Shi .......................... G06F 1/189 361/720 |
| 8,369,100 | B2 * | 2/2013 | Azuma .................... H01G 9/14 361/784 |
| 2007/0109715 | A1 | 5/2007 | Azuma et al. |

(Continued)

FOREIGN PATENT DOCUMENTS

| JP | 6-61108 A | 3/1994 |
| JP | 2002-197706 A | 7/2002 |

(Continued)

*Primary Examiner* — Tuan T Dinh
(74) *Attorney, Agent, or Firm* — Oblon, McClelland, Maier & Neustadt, L.L.P.

(57) ABSTRACT

According to one embodiment, a semiconductor storage device includes a board, a first electronic device mounted on the board, at least one second electronic device mounted on the board, and a heat dissipator. At least a portion of the second electronic device overlaps at least one of the board and the first electronic device in a first direction that is a thickness direction of the board. The heat dissipator includes a first member that includes a first portion located between the first electronic device and the second electronic device in the first direction, and a second member that includes a portion located between the first member and the second electronic device in the first direction. The second member is smaller in coefficient of thermal conductivity than the first member.

22 Claims, 11 Drawing Sheets

(58) Field of Classification Search
CPC .. H01G 2/04; H01G 2/10; H01G 9/00; H01G 9/008
USPC ....... 361/690–710, 737, 752, 760, 784, 803, 361/816
See application file for complete search history.

(56) References Cited

U.S. PATENT DOCUMENTS

| | | | |
|---|---|---|---|
| 2010/0053897 A1* | 3/2010 | Kusaka | G06F 1/203 |
| | | | 361/707 |
| 2013/0010428 A1* | 1/2013 | Hayashi | H01L 23/4093 |
| | | | 248/224.8 |
| 2013/0140079 A1* | 6/2013 | Nakamura | H01G 2/06 |
| | | | 174/551 |
| 2015/0189794 A1* | 7/2015 | Tashima | H05K 7/20854 |
| | | | 361/720 |
| 2018/0270943 A1* | 9/2018 | Suzuki | G06F 1/187 |
| 2018/0270991 A1* | 9/2018 | Suzuki | H05K 1/0203 |
| 2019/0006101 A1* | 1/2019 | Matsumae | H01G 9/08 |
| 2019/0276072 A1 | 9/2019 | Morimoto et al. | |

FOREIGN PATENT DOCUMENTS

| | | |
|---|---|---|
| JP | 2014-3059 A | 1/2014 |
| JP | 6658912 B2 | 3/2020 |

* cited by examiner

SEMICONDUCTOR STORAGE DEVICE AND HEAT DISSIPATOR

CROSS-REFERENCE TO RELATED APPLICATION

This application is based upon and claims the benefit of priority from Japanese Patent Application No. 2021-046831, filed Mar. 22, 2021; the entire contents of which are incorporated herein by reference.

FIELD

Embodiments described herein relate generally to a semiconductor storage device and a heat dissipator.

BACKGROUND

A semiconductor storage device including a board and an electronic device mounted on the board is known. In semiconductor storage devices, improving heat dissipation is desired.

DETAILED DESCRIPTION

Figure 1:
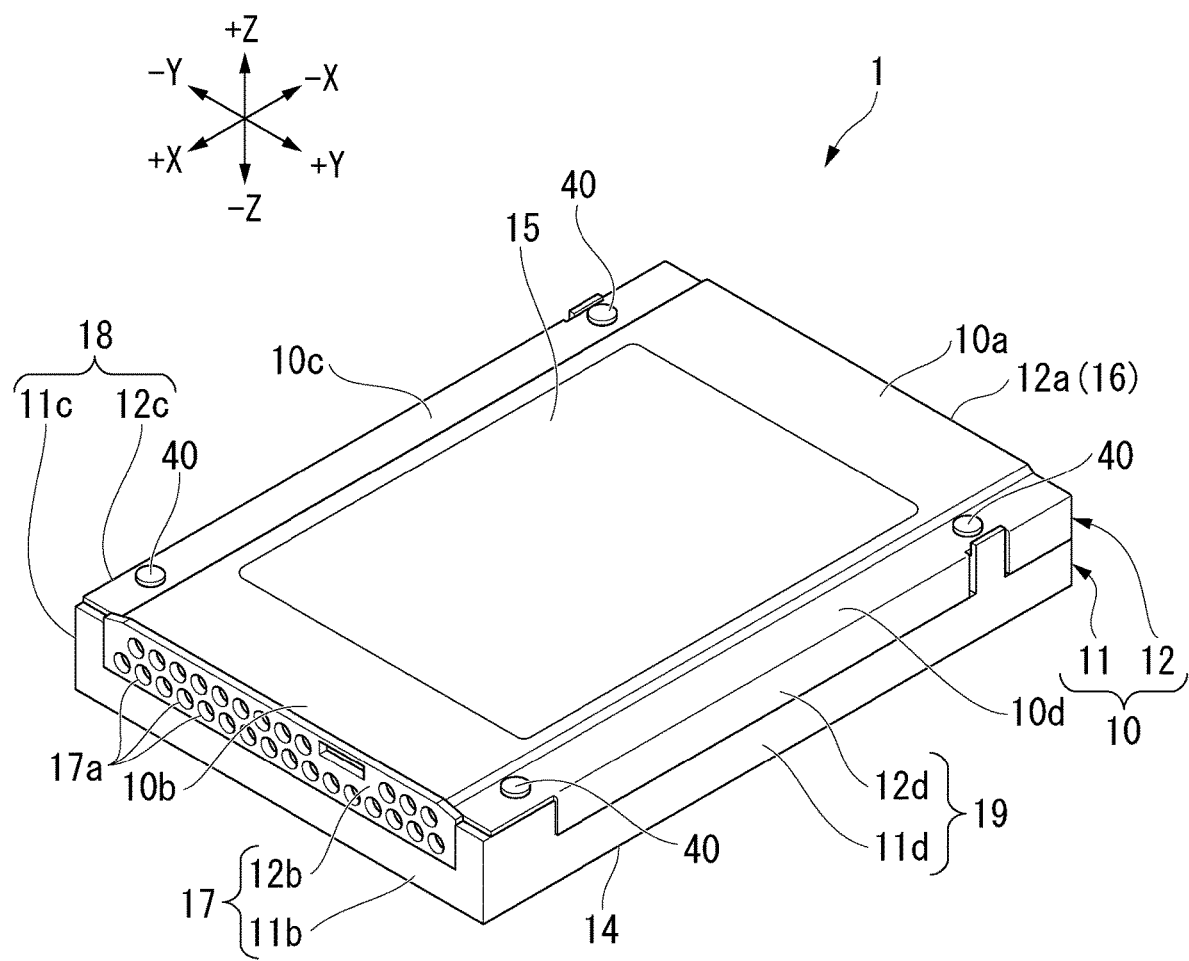
FIG. 1 is a perspective view showing a semiconductor storage device according to a first embodiment.

According to one embodiment, a semiconductor storage device includes a board, a first electronic device mounted on the board, at least one second electronic device mounted on the board, and a heat dissipator. At least a portion of the second electronic device overlaps at least one of the board and the first electronic device in a first direction that is a thickness direction of the board. The heat dissipator includes a first member that includes a first portion located between the first electronic device and the second electronic device in the first direction, and a second member that includes a portion located between the first member and the second electronic device in the first direction. The second member is smaller in coefficient of thermal conductivity than the first member.

Hereinafter, a semiconductor storage device and a heat dissipator according to embodiments will be described with reference to the drawings. In the following description, constituents having the same or similar function are denoted by the same references. Also, duplicated description of the constituents may be omitted. In the present specification, the term "overlap" means that virtual projection images of two objects overlap each other and may also include a case in which two objects are not directly in contact with each other. In the present specification, the terms "parallel", "perpendicular", and "the same as" may also include "substantially parallel", "substantially perpendicular", and "substantially the same as", respectively. In the present specification, the term "connection" is not limited to "mechanical connection" but may also include "electrical connection." That is, the term "connection" is not limited to a case of being directly connected to an object but may also include a case of being connected to an object via other members. Additionally, in the present specification, the term "connection" is not limited to a case of being coupled to each other but may also include a case of being only in contact with an object. Additionally, in the present specification, the phrase "at least one of A, B and C" means "at least A, at least B, at least C, or at least any combination of A, B and C."

Here, firstly, a +X direction, a −X direction, a +Y direction, a −Y direction, a +Z direction, and a −Z direction will be defined. The +X direction, the −X direction, the +Y direction, and the −Y direction are directions along a first surface 21a (refer to FIG. 2) of a board 21 to be described below. The +X direction is a direction from a first end 10a to a second end 10b of a housing 10 to be described below (refer to FIG. 1). The −X direction is a direction opposite to the +X direction. When the +X direction and the −X direction do not need to be distinguished from each other, the directions will be simply referred to as an "X direction." The +Y direction and the −Y direction are directions intersecting (for example, perpendicular to) the X direction. The +Y direction is a direction from a third end 10c to a fourth end 10d of the housing 10 to be described below (refer to FIG. 1). The −Y direction is a direction opposite to the +Y direction. When the +Y direction and the −Y direction do not need to be distinguished from each other, the directions will be simply referred to as a "Y direction." The +Z direction and the −Z direction are directions intersecting (for example, perpendicular to) the X direction and the Y direction, and are a thickness direction of the board 21 to be described below. The +Z direction is a direction from the board 21 to a second main wall 15 of the housing 10 to be described below (refer to FIG. 2). The −Z direction is a direction opposite to the +Z direction. When the +Z direction and the −Z direction do not need to be distinguished from each other, the directions will be simply referred to as a "Z direction." The Z direction is an example of "first direction."

First Embodiment

<1. Overall Configuration of Semiconductor Storage Device>

A semiconductor storage device according to a first embodiment will be described with reference to FIGS. 1 to 5. The semiconductor storage device 1 is a storage device such as a solid state drive (SSD). The semiconductor storage device 1 is configured to be attached to an information processing device such as a server or a personal computer and be used as a storage region of the information processing device. In the present specification, an information processing device to which the semiconductor storage device 1 is configured to be attached is referred to as a "host device."

Figure 2:
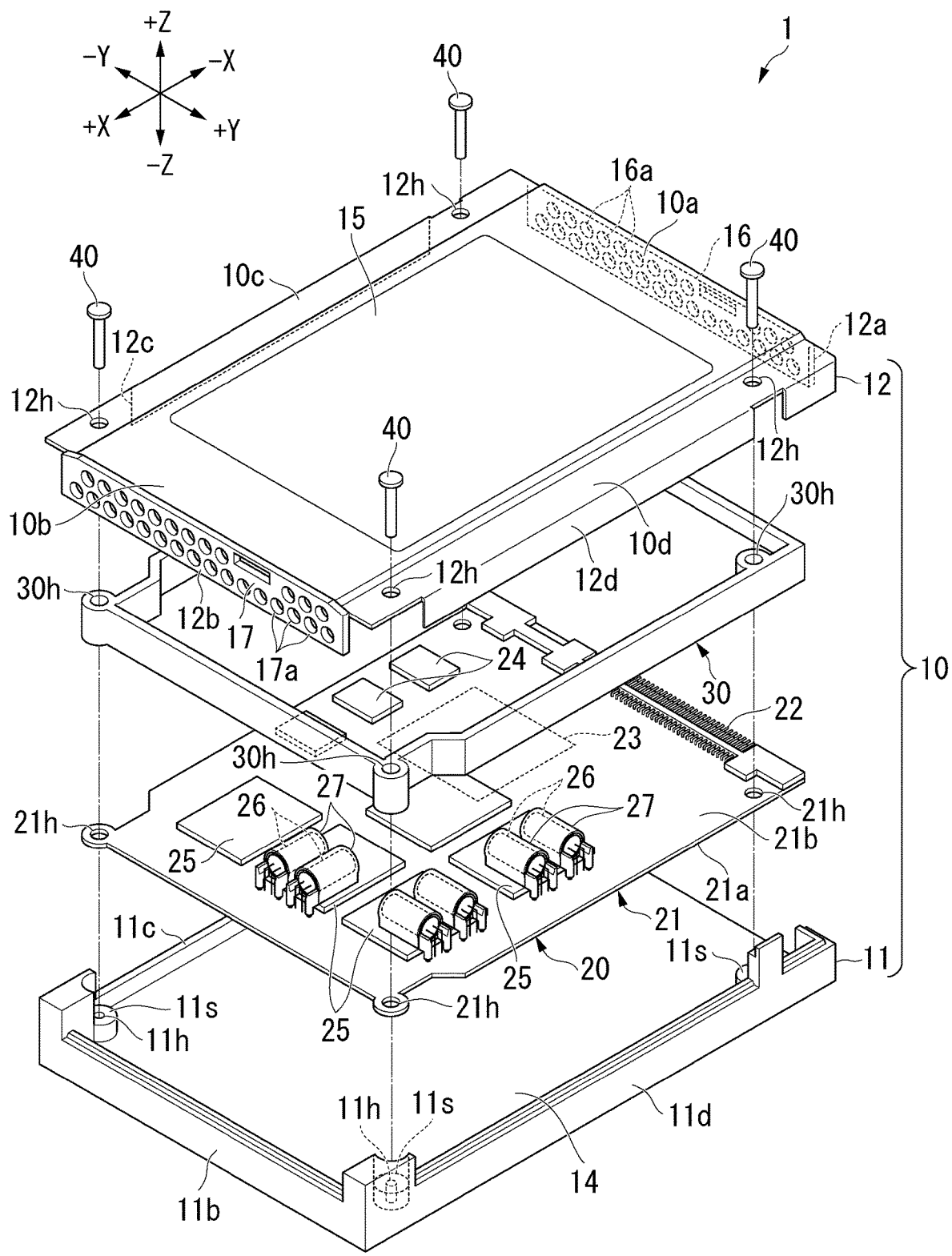
FIG. 2 is a partially exploded perspective view showing the semiconductor storage device according to the first embodiment.

FIG. 1 is a perspective view showing the semiconductor storage device 1. FIG. 2 is a partially exploded perspective view showing the semiconductor storage device 1. As shown in FIGS. 1 and 2, the semiconductor storage device 1 may include, for example, the housing 10, a board assembly 20, a support flame 30, and a plurality of fixing members 40.

<1.1 Housing>

As shown in FIG. 1, the housing 10 may be formed, for example, in a flat rectangular box shape. The housing 10 may be made of, for example, metal. As a pair of ends separated in a longitudinal direction (the X direction) of the housing 10, the housing 10 includes the first end 10a and the second end 10b. The second end 10b is the end on a side opposite to the first end 10a. At the first end 10a, an opening (not shown in the drawings) is provided which causes a connector 22 (refer to FIG. 2) of the board assembly 20 (described below) to be exposed to the outside of the housing 10. On the other hand, as a pair of ends separated in a short-side direction (the Y direction) of the housing 10, the housing 10 includes the third end 10c and the fourth end 10d. The fourth end 10d is the end on a side opposite to the third end 10c.

As shown in FIG. 2, the housing 10 includes a base 11, and a cover 12 and is formed by combining the base 11 and the cover 12. The base 11 includes, for example, a first main wall 14 and three side walls 11b, 11c, and 11d. The first main wall 14 is the wall extending in the X direction and the Y direction. The three side walls 11b, 11c, and 11d extend from the first main wall 14 in the +Z direction at the second end 10b, the third end 10c, and the fourth end 10d of the housing 10, respectively. The cover 12 includes the second main wall 15 and four side walls 12a, 12b, 12c, and 12d. The second main wall 15 is the wall extending in the X direction and the Y direction. The four side walls 12a, 12b, 12c, and 12d extend from the second main wall 15 in the −Z direction at the first end 10a, the second end 10b, the third end 10c, and the fourth end 10d of the housing 10, respectively. The base 11 is an example of "first housing member." The cover 12 is an example of "second housing member."

In the embodiment, the housing 10 is formed to include a first side wall 16, a second side wall 17, a third side wall 18, and a fourth side wall 19 by combining the base 11 and the cover 12 (refer to FIG. 1). The first side wall 16 is the side wall on the −X direction side and is formed by the side wall 12a of the cover 12. The second side wall 17 is the side wall on the +X direction side and is formed by the side wall 11b of the base 11 and the side wall 12b of the cover 12. Each of the first side wall 16 and the second side wall 17 is the wall extending in the Y direction and the Z direction. The third side wall 18 is the side wall on the −Y direction side and is formed by the side wall 11c of the base 11 and the side wall 12c of the cover 12. The fourth side wall 19 is the side wall on the +Y direction side and is formed by the side wall 11d of the base 11 and the side wall 12d of the cover 12. Each of the third side wall 18 and the fourth side wall 19 is the wall extending in the X direction and the Z direction.

As shown in FIG. 2, the first side wall 16 of the housing 10 has a plurality of first vent holes 16a. Similarly, the second side wall 17 of the housing 10 has a plurality of second vent holes 17a. Any one of the first vent holes 16a and the second vent holes 17a may function as suction holes, and any one of them may function as exhaust holes. For example, when the semiconductor storage device 1 is placed where air flows to the +X direction, air outside the housing 10 flows into the housing 10 from the first vent holes 16a and is exhausted to the outside of the housing 10 through the second vent holes 17a. On the other hand, when the semiconductor storage device 1 is placed where air flows to the −X direction, air outside the housing 10 flows into the housing 10 from the second vent holes 17a and is exhausted to the outside of the housing 10 through the first vent holes 16a.

The base 11 includes a plurality of supports 1 is on which the board 21 to be described below is mounted. The supports 1 is are provided so as to correspond to four corners of the housing 10. Each of the supports 11s includes a fixation hole 11h into which a fixing member 40 to be described below is inserted and fixed. The cover 12 includes a plurality of insertion holes 12h. The fixing member 40 passes through each of the insertion holes 12h. The insertion hole 12h is provided at a position corresponding to the fixation hole 11h.

<1.2 Board Assembly>

The board assembly 20 located between the base 11 and the cover 12 of the housing 10 and is housed in the housing 10. The board assembly 20 includes the board 21, the connector 22, a controller 23, a plurality of Dynamic Random Access Memories 24 (DRAMs 24), a plurality of semiconductor memory devices such as NAND flash memories 25 (hereinbelow, referred to as "NANDs 25" or "NAND 25"), a plurality of capacitors 26, and a plurality of heat dissipation caps 27.

The board 21 is formed in a plate shape extending in the X direction and the Y direction. The board 21 is, for example, a printed-wiring board and includes an insulating base member and a wiring pattern provided on the insulating base member. The board 21 has the first surface 21a and a second surface 21b located on the opposite side of the first surface 21a. The first surface 21a is directed to the −Z direction and faces an inner surface of the first main wall 14 of the housing 10. On the other hand, the second surface 21b is directed to the +Z direction and faces an inner surface of the second main wall 15 of the housing 10. The board 21 is mounted on the supports 11s provided on the base 11. The board 21 includes a plurality of insertion holes 21h. The fixing member 40 passes through each of the insertion holes 21h. The insertion hole 21h is provided at a position corresponding to the fixation hole 11h of the support 11s of the base 11.

The connector 22 is provided at the end of the board 21 on the −X direction side. The connector 22 includes a plurality of metal terminals. The connector 22 is exposed to the outside of the housing 10 through the opening (not shown in the drawings) provided at the first end 10a of the housing 10. The connector 22 is connectable to a connector of the host device.

The controller 23 may be mounted on, for example, the first surface 21a of the board 21. The controller 23 generally controls the entire semiconductor storage device 1. The controller 23 is a semiconductor package that includes a system-on-a-chip (SoC) in which, for example, a host interface circuit for a host device, a control circuit that controls the plurality of DRAMs 24, a control circuit that controls the plurality of NANDs 25, and the like are integrated in one semiconductor chip. The controller 23 is connected to the first main wall 14 of the housing 10 via a heat conductive member (not shown in the drawings). Consequently, part of heat generated from the controller 23 is transferred to the first main wall 14 of the housing 10 and is dissipated from the first main wall 14 of the housing 10 to the outside of the housing 10.

The DRAMs 24 are mounted on, for example, the second surface 21b of the board 21. The DRAM 24 is, for example, a semiconductor package that includes a volatile semiconductor memory chip. The DRAM 24 serves as a data buffer in which data received from the host device and data read from the NAND 25 are temporarily stored. Note that the semiconductor storage device 1 does not have to include the DRAMs 24.

The NANDs 25 are mounted on, for example, the second surface 21b of the board 21. The plurality of NANDs 25 are arranged to align in the X direction and the Y direction. The NAND 25 is, for example, a semiconductor package that includes a nonvolatile semiconductor memory chip. The NAND 25 is an example of "first electronic device." The NAND 25 is a device generating heat during operation and is also an example of "heat generator." However, "first electronic device" and "heat generator" are not limited to the NAND 25 but may be the controller 23, the DRAM 24, or another device.

The capacitors 26 are mounted on, for example, the second surface 21b of the board 21. The capacitors 26 each function as a backup power supply for data protection at the time of unexpected power interruption. For example, when power supply from the host device is unexpectedly interrupted, the capacitors 26 supply power to the controller 23, the DRAMs 24, the NANDs 25, and the like for a certain period of time. The capacitor 26 is, for example, an electrolytic capacitor. Furthermore, the capacitor 26 may be, for example, an aluminum electrolytic capacitor. The capacitor 26 is not limited to the aforementioned example. The capacitor 26 is an example of "second electronic device."

The heat dissipation cap 27 is attached to the capacitor 26. The heat dissipation cap 27 is an example of "heat dissipator." In the present specification, "heat dissipator" is not limited to a component having a heat dissipation function such as a heatsink but may be a heat transfer component that transfers heat from a component to another component. In the embodiment, the heat dissipation caps 27 have a function of transferring part of heat generated from the NANDs 25 to the second main wall 15 of the housing 10. The heat dissipation caps 27 will be described in detail below.

<1.3 Support Flame>

The support flame 30 is located between the board 21 and the cover 12. The support flame 30 is a spacer that fills a gap between the board 21 and the cover 12. The support flame 30 is formed in, for example, a frame shape along the periphery of the board 21. The support flame 30 is mounted on the second surface 21b of the board 21. The support flame 30 includes a plurality of insertion holes 30h. The fixing member 40 passes through each of the insertion holes 30h. The insertion hole 30h is provided at a position corresponding to the fixation hole 11h of the support 11s of the base 11. Note that, the support flame 30 may be omitted. In this case, for example, the cover 12, the board 21, and the base 11 may be integrally fixed by fastening them together using the fixing member 40.

<1.4 Fixing Member>

The fixing member 40 is inserted into the insertion hole 12h of the cover 12, the insertion hole 30h of the support flame 30, the insertion hole 21h of the board 21, and the fixation hole 11h of the base 11 and integrally fixes together the cover 12, the support flame 30, the board 21, and the base 11. The fixing member 40 may be, for example, a screw or a fitting member such as a pin. However, "fixing member" explained in the present specification is not limited to the aforementioned example. The fixing member 40 is not limited to a fixing member that fixes together both the base 11 and the cover 12 but may be a fixing member that fixes only one of the base 11 and the cover 12 to the board 21.

<2. Heat Dissipation Cap>

<2.1 Surrounding Configuration of Position at which Heat Dissipation Cap is Provided>

Next, the heat dissipation cap 27 will be described.

Figure 3:
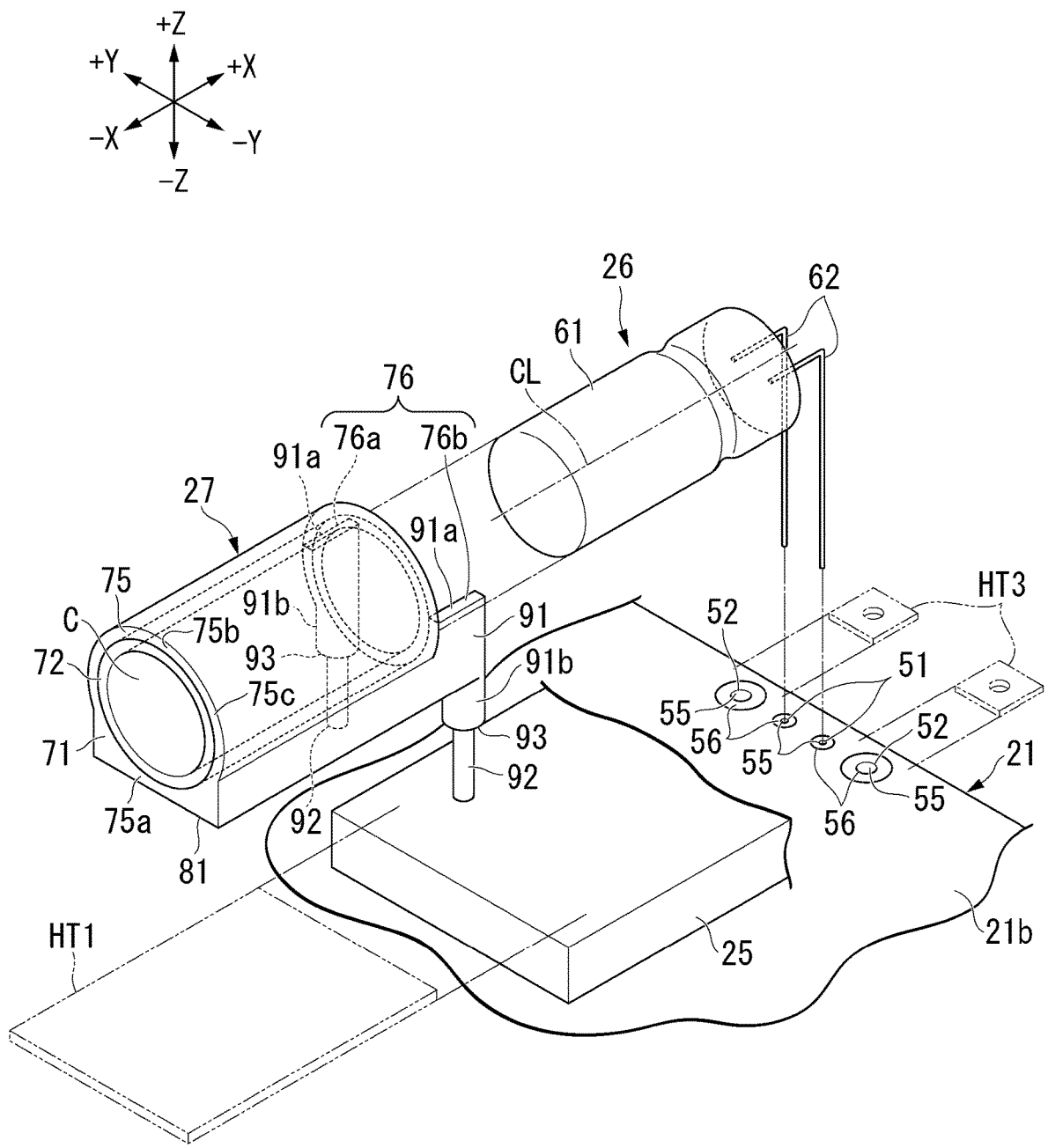
FIG. 3 is a partially exploded perspective view showing a configuration associated with a heat dissipation cap according to the first embodiment.
Figure 4:
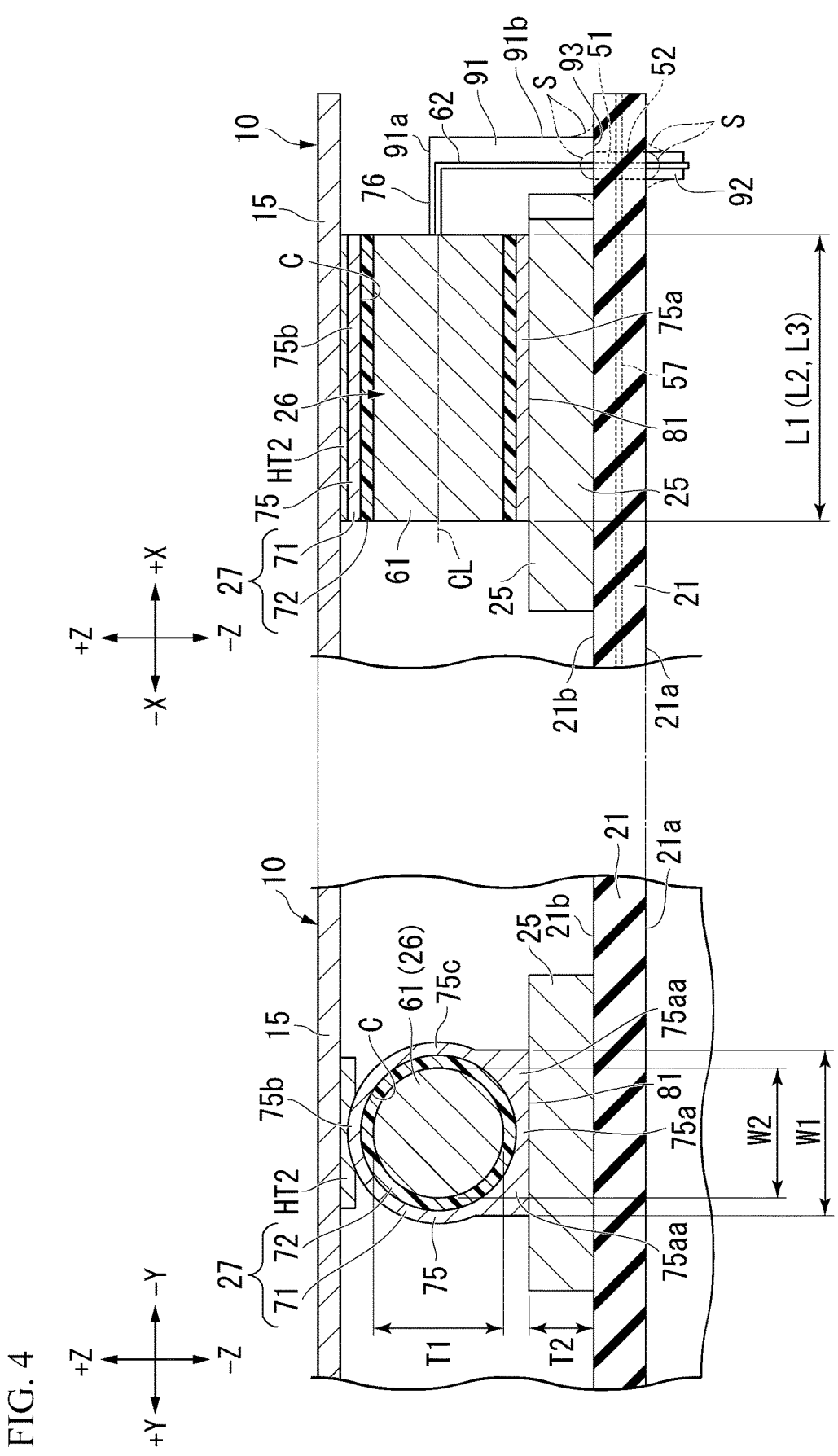
FIG. 4 is a cross-sectional view showing the semiconductor storage device according to the first embodiment.

FIG. 3 is a partially exploded perspective view showing a configuration associated with the heat dissipation cap 27. FIG. 4 is a cross-sectional view showing the semiconductor storage device 1 according to the embodiment. FIGS. 3 and 4 show the configuration that is associated with, for example, the heat dissipation cap 27 which is located at the end of the board 21 on the +X direction side. For convenience of the explanation, FIGS. 3 and 4 show that one capacitor 26 and one heat dissipation cap 27 are disposed on one NAND 25. However, as shown in FIG. 2, a plurality of the capacitors 26 and a plurality of the heat dissipation caps 27 may be disposed on one NAND 25.

As shown in FIG. 3, the board 21 includes a pair of second fixation holes 51 to which the capacitor 26 is fixed and a pair of first fixation holes 52 to which the heat dissipation cap 27 is fixed. The diameter of the first fixation hole 52 is larger than the diameter of the second fixation hole 51. The second fixation hole 51 and the first fixation hole 52 are each, for example, a through hole provided on the board 21. An electroconductive layer 55 formed by, for example, plating treatment is provided on the inner peripheral surfaces of the second fixation holes 51 and the first fixation holes 52. On the first surface 21a and the second surface 21b of the board 21, lands 56 formed by plating treatment are provided around the second fixation holes 51 and the first fixation holes 52. The land 56 provided around the first fixation hole 52 is connected to, for example, a ground layer 57 of the board 21 (refer to FIG. 4). The ground layer 57 is an electroconductive layer having a surface in the X direction and the Y direction and has a relatively wide surface area inside the board 21. When the semiconductor storage device 1 is connected to the host device, a ground potential is provided to the ground layer 57. The ground potential functions as a reference potential of the controller 23 and the NAND 25.

The capacitor 26 includes a capacitor body 61 and a pair of leads 62. The capacitor body 61 is formed in a cylindrical shape having the central axis CL extending in the X direction. The X direction corresponds to a longitudinal direction of the capacitor body 61. The capacitor body 61 is an example of "component body." The capacitor body 61 is also an example of "columnar portion." The leads 62 are connected to the board 21. The lead 62 is an example of "connecting member." Each lead 62 protrudes from the end of the capacitor body 61 toward the +X direction and is bent to be directed to the −Z direction. That is, to reduce the height of the capacitor 26 when mounted on the board 21, the leads 62 are bent. The capacitor body 61 is mounted on the board 21 so as to extend in the X direction.

As shown in FIG. 4, in the Z direction, the capacitor body 61 is disposed on the opposite side of the board 21 with respect to the NAND 25. At least a portion of the capacitor body 61 overlaps the NAND 25 in the Z direction. In the embodiment, at least a portion of the capacitor body 61 is located between the NAND 25 and the inner surface of the second main wall 15 of the housing 10 in the Z direction. In the embodiment, the entire capacitor body 61 is located between the NAND 25 and the inner surface of the second main wall 15 of the housing 10. Instead of this structure, for example, part of the capacitor body 61 may only be located between the NAND 25 and the inner surface of the second main wall 15 of the housing 10. The thickness T1 of the capacitor body 61 in the Z direction (for example, maximum thickness) is larger than, for example, the thickness T2 of the NAND 25 in the Z direction (for example, maximum thickness).

Each lead 62 protrudes from the end of the capacitor body 61 toward the +X direction and extends so as to reach the position at which the lead 62 does not overlap the NAND 25 in the Z direction. Each lead 62 is bent to be directed to the board 21 at the position at which the lead 62 does not overlap the NAND 25 in the Z direction, and the lead 62 is inserted into the second fixation hole 51 of the board 21. The leads 62 are fixed to the board 21 by solder S. The solder S is supplied to the first surface 21a of the board 21 and the land 56 of the second surface 21b.

<2.2 Configuration of Heat Dissipation Cap>

As shown in FIG. 4, the heat dissipation cap 27 is attached to the capacitor 26. The heat dissipation cap 27 includes an outer layer member 71 and an inner layer member 72. For example, the heat dissipation cap 27 has a double-layered structure configured of the outer layer member 71 and the inner layer member 72. The outer layer member 71 is an example of "first member." The inner layer member 72 is an example of "second member."

<2.2.1 Outer Layer Member>

The outer layer member 71 has a function of prompting heat dissipation of the NAND 25. In the embodiment, the outer layer member 71 also has a function of improving a shock resistance of the capacitor 26. The outer layer member 71 is formed of a material having a first coefficient of thermal conductivity which is relatively high. For example, the outer layer member 71 is formed of a metal material such as copper or aluminum. Instead of this structure, for example, the outer layer member 71 may be formed of a resin material or the like including electroconductive fillers (for example, metal filler). The outer layer member 71 includes, for example, a ring 75 and a support 76.

The ring 75 is formed in, for example, a ring shape along the external shape of the capacitor body 61. The ring 75 surrounds the peripheral surface of the capacitor body 61 from the outer-periphery side. In other words, inside the ring 75, a container C is formed that contains the capacitor body 61 and the inner layer member 72 to be described below therein. The length L1 of the ring 75 in a direction (the X direction) along the central axis CL of the capacitor body 61 is longer than or equal to half of the length L2 of the capacitor body 61 in the X direction. FIG. 4 shows that the length L1 of the ring 75 is the same as the length L2 of the capacitor body 61.

The ring 75 includes a first portion 75a, a second portion 75b, and a third portion 75c. However, the first portion 75a, the second portion 75b, and the third portion 75c are named for convenience of the explanation, and a physical boundary between the portions may not exist. In the embodiment, the first portion 75a, the second portion 75b, and the third portion 75c are formed integrally with each other.

The first portion 75a is located between the NAND 25 and the capacitor body 61 in the Z direction. The first portion 75a is a heat receiver that is connected to the NAND 25 and receives heat generated from the NAND 25. In the embodiment, the first portion 75a is connected to the NAND 25 by being directly in contact with the surface of the NAND 25. Instead of this structure, the first portion 75a may be connected to the NAND 25 via a heat transferer HT1 (refer to FIG. 3, for example, a heat conductive sheet) sandwiched between the first portion 75a and the NAND 25. The heat transferer HT1 is an example of "first heat transferer."

In the embodiment, the first portion 75a includes a pair of projected portions 75aa protruding in a radial-outer direction of the ring 75 on both sides of the capacitor body 61 in the Y direction and, includes a flat portion 81 facing a surface of the NAND 25. The Y direction corresponds to a direction parallel to the surface of the NAND 25. The flat portion 81 spreads, for example, in parallel to the surface of the NAND 25. The flat portion 81 may be directly connected to the NAND 25 (or via the heat transferer HT1). In the embodiment, the width W1 (for example, maximum width) of the flat portion 81 in the Y direction is larger than, for example, the width W2 (for example, maximum width) of the capacitor 26 in the Y direction. The flat portion 81 is an example of "first face."

The second portion 75b is a heat dissipating member that dissipates or transfers the heat received by the first portion 75a from the NAND 25 to another component. The second portion 75b is located on the opposite side of the first portion 75a with respect to at least a portion of the capacitor 26 in the Z direction. In the embodiment, the second portion 75b is located closer to the inner surface the second main wall 15 of the housing 10 than part of the capacitor 26. In the embodiment, the second portion 75b is a heat dissipating member that transfers part of the heat received by the first portion 75a from the NAND 25 to the second main wall 15 of the housing 10. For example, the second portion 75b is connected to the inner surface of the second main wall 15 of the housing 10 via a heat transferer HT2 (for example, heat conductive sheet) sandwiched between the second portion 75b and the second main wall 15 of the housing 10. The heat transferer HT2 is an example of "second heat transferer." Instead of this structure, the second portion 75b may be connected to the second main wall 15 of the housing 10 by being directly in contact with the inner surface of the second main wall 15 of the housing 10 without interposing the heat transferer HT2 therebetween.

In the embodiment, the second portion 75b is formed in an arc shape along the external shape of the capacitor body 61. The heat transferer HT2 has elasticity or flexibility which is deformable between the second portion 75b and the second main wall 15 of the housing 10. Because of this, a heat conductive area between the second portion 75b and the second main wall 15 of the housing 10 increases.

The third portion 75c is provided between the first portion 75a and the second portion 75b. The third portion 75c is a heat transferring member that transfers the heat received by the first portion 75a from the NAND 25 to the second portion 75b. In the embodiment, the third portion 75c is formed in an arc shape along the external shape of the capacitor body 61.

Next, the support 76 of the outer layer member 71 will be described.

The support 76 protrudes from the ring 75, is fixed to the board 21, and supports the ring 75. Additionally, the support 76 transfers part of the heat, which is transferred from the NAND 25 to the ring 75, to the board 21 by being fixed to the board 21 (e.g., by being connected to the board 21). The support 76 is an example of "heat dissipating member." In the embodiment, the support 76 includes a first support 76a and a second support 76b (refer to FIG. 3) which are separately disposed at both sides of the capacitor 26 when viewed from the direction in which the lead 62 protrudes from the capacitor body 61. Each of the first support 76a and the second support 76b includes an extending portion 91 and a fixation portion 92.

The extending portion 91 includes a first portion 91a and a second portion 91b. The first portion 91a protrudes from the end of the ring 75 toward the +X direction and extends in the +X direction so as to reach the position at which the first portion 91a does not overlap the NAND 25 in the Z direction. The second portion 91b is bent from one end of the first portion 91a at the position at which the second portion 91b does not overlap the NAND 25 in the Z direction, is directed to the −Z direction, and extends toward the board 21. An end of the second portion 91b is in contact with the second surface 21b of the board 21. Instead of the extending portion 91 that is connected to the board 21 by being directly in contact with the board 21, the extending portion 91 may be connected to the board 21 via a heat transferer HT3 interposed therebetween (refer to FIG. 3). The heat transferer HT3 is an example of "third heat transferer."

The fixation portion 92 is provided at the end of the extending portion 91 in the −Z direction (that is, one end of the second portion 91b). The fixation portion 92 is inserted into the first fixation hole 52 of the board 21. Each of the first support 76a and the second support 76b is connected to the land 56 and is fixed to the board 21 with the solder S. The solder S is supplied to the first surface 21a of the board 21 and the land 56 of the second surface 21b. In the embodiment, each of the first support 76a and the second support 76b is connected to the ground layer 57 of the board 21 via the land 56. The fixation portion 92 is thicker than, for example, the lead 62. Note that, the land 56 on which the solder S is provided may be provided on only one of the first surface 21a and the second surface 21b of the board 21.

In the embodiment, the fixation portion 92 is thinner than the extending portion 91. For example, the fixation portion 92 is thinner than the second portion 91b of the extending portion 91. In other words, the fixation portion 92 has a smaller area than the second portion 91b in a cross section orthogonal to the Z direction. Therefore, a step 93 is formed between the second portion 91b of the extending portion 91 and the fixation portion 92. In the embodiment, alignment of the heat dissipation caps 27 in the height position is carried out by causing the step 93 to come into contact with the second surface 21b of the board 21. The fixation portion 92 is an example of "third portion."

In the embodiment, the first support 76a and the second support 76b are separately disposed at positions next to the leads 62 of the capacitor 26 in the Y direction. Therefore, a support structure that supports the capacitor 26 is formed by the first support 76a and the second support 76b at both sides of the capacitor 26.

<2.2.2 Inner Layer Member>

Next, the inner layer member 72 will be described.

The inner layer member 72 has a function of inhibiting, the heat received by the outer layer member 71 from the NAND 25, from being transferred to the capacitor 26. In the embodiment, since the inner layer member 72 is used along with the outer layer member 71, the inner layer member 72 also has a function of improving a shock resistance of the capacitor 26. The inner layer member 72 is formed of a material having a second coefficient of thermal conductivity. The second coefficient of thermal conductivity is smaller than the first coefficient of thermal conductivity that is a coefficient of thermal conductivity of a material used to form the outer layer member 71. For example, the inner layer member 72 is formed of a resin material such as urethane resin.

As shown in FIG. 4, the inner layer member 72 is formed in, for example, a ring shape along the external shape of the capacitor body 61. The inner layer member 72 is provided between the ring 75 of the outer layer member 71 and the capacitor body 61. Part of the inner layer member 72 is located between the ring 75 of the outer layer member 71 and the capacitor body 61 in the Z direction. Inside the ring 75 of the outer layer member 71, the inner layer member 72 surrounds the peripheral surface of the capacitor body 61 from the outer-periphery side. That is, in the embodiment, a double ring structure is formed by the ring 75 of the outer layer member 71 and the inner layer member 72. The length L3 of the inner layer member 72 in the direction along the central axis CL of the capacitor body 61 (i.e., the X direction) is longer than or equal to, for example, the length 1, of the ring 75 of the outer layer member 71 in the X direction.

In the embodiment, the outer diameter of the inner layer member 72 is slightly smaller than the inner diameter of the ring 75 of the outer layer member 71. The inner peripheral face of the ring 75 of the outer layer member 71 and the outer peripheral face of the inner layer member 72 are in clearance fit. In other words, a micro gap is provided between the inner peripheral face of the ring 75 of the outer layer member 71 and the outer peripheral face of the inner layer member 72. In this configuration, the inner layer member 72 and the outer layer member 71 are attachable to and detachable from each other and are independently attachable to the capacitor 26. Instead of this structure, the inner layer member 72 and the outer layer member 71 may be in transition fit or interference fit.

<2.3 Assembling Method of Heat Dissipation Cap>

FIGS. 5A to 5E are cross-sectional views showing an example of an assembling method of the heat dissipation cap 27.

In the embodiment, the heat dissipation cap 27 is assembled to the capacitor 26 before the capacitor 26 is mounted on the board 21. In detail, firstly, the inner layer member 72 is assembled to the capacitor 26 (refer to FIG. 5A). That is, the capacitor body 61 is inserted into the inner layer member 72.

Figure 5A:
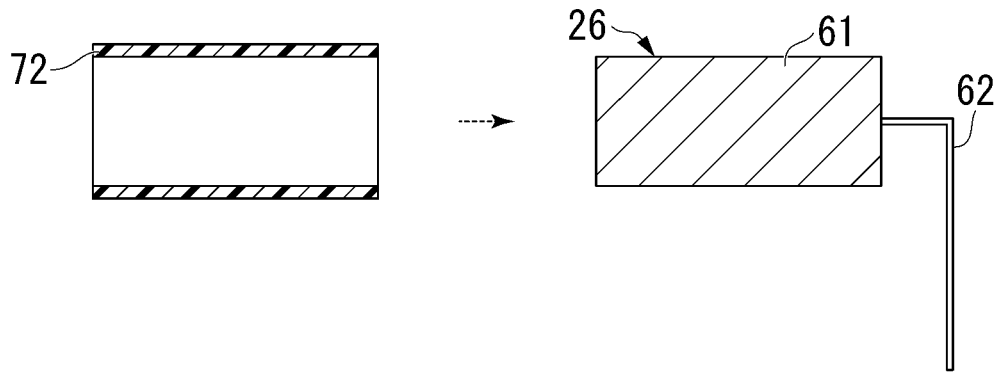
FIG. 5A is a cross-sectional view showing an example of an assembling method of the heat dissipation cap according to the first embodiment.
Figure 5B:
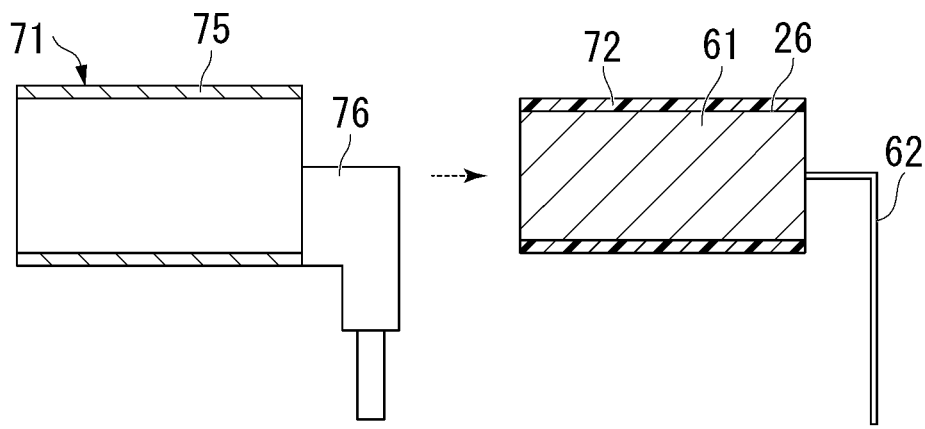
FIG. 5B is a cross-sectional view showing the example of the assembling method of the heat dissipation cap according to the first embodiment.
Figure 5C:
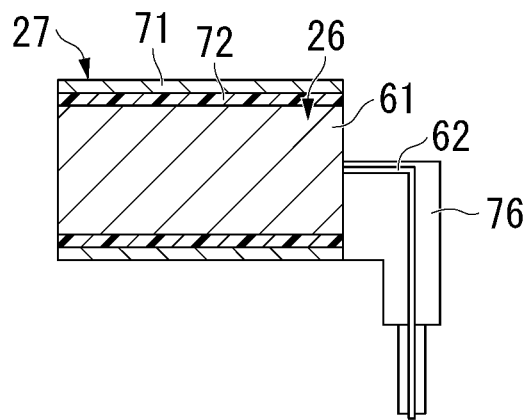
FIG. 5C is a cross-sectional view showing the example of the assembling method of the heat dissipation cap according to the first embodiment.

Next, the outer layer member 71 is assembled to the inner layer member 72 (refer to FIG. 5B). That is, the inner layer member 72 and the capacitor body 61 are inserted into the inside of the ring 75 of the outer layer member 71. Consequently, the capacitor body 61 is housed in the heat dissipation cap 27 having the double-layered structure (refer to FIG. 5C).

Figure 5D:
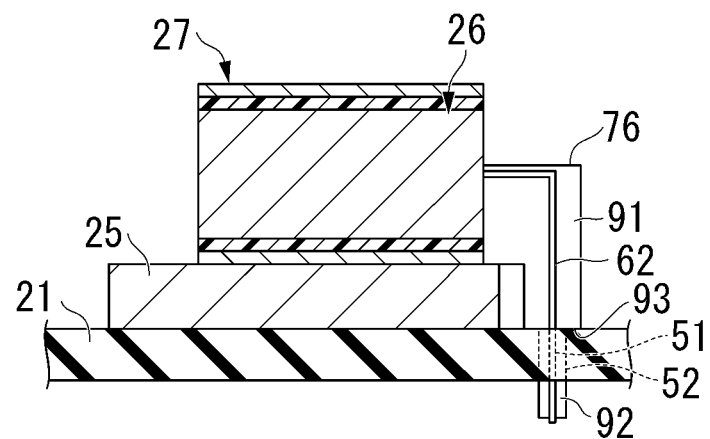
FIG. 5D is a cross-sectional view showing the example of the assembling method of the heat dissipation cap according to the first embodiment.
Figure 5E:
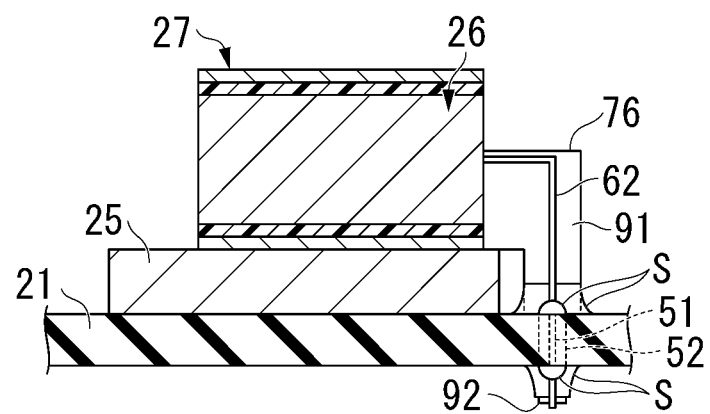
FIG. 5E is a cross-sectional view showing the example of the assembling method of the heat dissipation cap according to the first embodiment.

Next, the capacitor 26 and the heat dissipation cap 27 which are integrated in one body is assembled to the board 21 (refer to FIG. 5D). That is, the heat dissipation cap 27 is mounted on the NAND 25, the leads 62 of the capacitor 26 are inserted into the second fixation holes 51 of the board 21, and the fixation portions 92 of the support 76 of the heat dissipation cap 27 are inserted into the first fixation holes 52 of the board 21. Finally, as shown in FIG. 5E, the solder S is supplied to the peripheries of the second fixation hole 51 and of the first fixation hole 52 on the first surface 21a and the second surface 21b of the board 21, the board 21 and the leads 62 of the capacitor 26 are fixed by the solder S, and the board 21 and the support 76 of the heat dissipation cap 27 are fixed by the solder S.

<3. Action>
<3.1 Action Regarding Heat Dissipation>

As shown in FIG. 4, in the configuration in which the outer layer member 71 of the heat dissipation cap 27 is connected to the NAND 25, part of the heat generated from the NAND 25 is transferred from the NAND 25 to the outer layer member 71. The outer layer member 71 is connected to the second main wall 15 of the housing 10 via the heat transferer HT2. Accordingly, part of the heat transferred from the NAND 25 to the outer layer member 71 is transferred from the outer layer member 71 to the housing 10 and is dissipated from the surface of the housing 10 to the outside of the housing 10. Consequently, heat dissipation from of the NAND 25 is prompted.

Moreover, in the embodiment, the other part of the heat transferred from the NAND 25 to the outer layer member 71 is transferred from the support 76 of the outer layer member 71 to the board 21 and is dissipated from the surface of the board 21 to the internal space of the housing 10. Consequently, heat dissipation from of the NAND 25 is prompted. For example, in the configuration in which the support 76 of the outer layer member 71 is connected to the ground layer 57 of the board 21, part of the heat transferred from the NAND 25 to the outer layer member 71 is dissipated through the ground layer 57 to a region inside the board 21. In this case, the heat transferred from the support 76 of the outer layer member 71 to the board 21 is dissipated from a wider region of the board 21 to the internal space of the housing 10.

<3.2 Action Regarding Shock Resistance>

As shown in FIG. 4, the capacitor body 61 is supported by the heat dissipation cap 27 mounted on the NAND 25. Therefore, even when shock is applied to the semiconductor storage device 1, the capacitor body 61 is restricted from being greatly moved, and a great force is less easily to be applied to the connection portion between the leads 62 and the board 21. Accordingly, the shock resistance is improved. From another point, the capacitor body 61 is supported by the heat dissipation cap 27 including the support 76 fixed to the board 21. Consequently, even when shock is applied to the semiconductor storage device 1, the capacitor body 61 is restricted from being greatly moved, and a great force is less easily to be applied to the connection portion between the leads 62 and the board 21. Accordingly, the shock resistance is improved <4. Advantage>

As Comparative Example, a configuration in which the heat dissipation cap 27 is not provided will be described. That is, to reduce the size of a semiconductor storage device, a configuration is conceived in which the capacitor body 61 is disposed above the NAND 25 in a horizontal direction therealong, and the leads 62 of the capacitor 26 are bent to be connected to the board 21. In this case, a degree of heat dissipation of the NAND 25 located directly under the capacitor body 61 is likely to decrease. Furthermore, the distances from the capacitor body 61 to the connection portion between the lead 62 and the board 21 becomes longer. For this reason, when shock is applied to the semiconductor storage device, a great force is likely to be applied to the connection portion between the lead 62 and the board 21. As a result, there is a possibility that the solder included in the connection portion is cracked. Consequently, the shock resistance of the semiconductor storage device is likely to be degraded.

On the other hand, in the embodiment, the heat dissipation cap 27 includes the outer layer member 71 and the inner layer member 72. The outer layer member 71 includes the first portion 75a located between the NAND 25 and the capacitor 26 in the Z direction and is formed of a material having the first coefficient of thermal conductivity. The inner layer member 72 includes a portion located between the outer layer member 71 and the capacitor 26 and is formed of a material having the second coefficient of thermal conductivity smaller than the first coefficient of thermal conductivity. With this configuration, part of heat generated from the NAND 25 is dissipated or is transferred to another component by the outer layer member 71. As a result, heat dissipation from of the NAND 25 is prompted, and heat dissipation of the semiconductor storage device 1 can be improved. According to the aforementioned configuration, even when the outer layer member 71 receives heat from the NAND 25, since the inner layer member 72 is provided, heat is less easily to be transferred to the capacitor 26. Consequently, it is possible to prevent the product life of the capacitor 26 from being shorter due to heat transferred to the capacitor 26.

In the embodiment, the first portion 75a of the outer layer member 71 is connected to the NAND 25 directly (that is, the outer layer member 71 is directly in contact with the NAND 25) or via the heat transferer HT1. According to this configuration, the outer layer member 71 can effectively receive the heat generated from the NAND 25. As a result, heat dissipation of the semiconductor storage device 1 can be further improved.

In the embodiment, the first portion 75a of the outer layer member 71 includes the flat portion 81 facing the surface of the NAND 25. The flat portion 81 is connected to the NAND 25 directly or via the heat transferer HT1. With this configuration, a heat conductive area between the outer layer member 71 and the NAND 25 can be ensured to be large. Consequently, heat dissipation of the semiconductor storage device 1 can be further improved.

In the embodiment, the second portion 75b of the outer layer member 71 is connected to the housing 10 directly or via the heat transferer HT2. According to this configuration, the outer layer member 71 can dissipate part of the heat received from the NAND 25 to the outside of the housing 10 therethrough. For this reason, heat dissipation of the semiconductor storage device 1 can be further improved.

In the embodiment, the outer layer member 71 includes the support 76 that is located at the region on which the support 76 does not overlap the NAND 25 in the Z direction.

The support 76 is connected to the board 21 directly or via the heat transferer HT3. With this configuration, the outer layer member 71 transfers part of the heat received from the NAND 25 to the board 21 and can dissipate heat through the board 21. Accordingly, heat dissipation of the semiconductor storage device 1 can be further improved.

In the embodiment, the support 76 of the outer layer member 71 is fixed to the board 21 by the solder S. According to this configuration, the outer layer member 71 can effectively transfer part of the heat received from the NAND 25 to the board 21. Because of this, heat dissipation of the semiconductor storage device 1 can be further improved.

In the embodiment, the capacitor 26 include the capacitor body 61 and the leads 62 that protrude from the capacitor body 61, are bent to be directed to the board 21, and are connected to the board 21. The outer layer member 71 includes the support 76 fixed to the board 21. With this configuration, even when the distance from the capacitor body 61 to the connection portion between the lead 62 and the board 21 is long, the capacitor body 61 is supported by the heat dissipation cap 27 including the support 76 fixed to the board 21. Accordingly, a great force is less easily to be applied to the connection portion between the lead 62 and the board 21. Consequently, the shock resistance of the semiconductor storage device 1 can be improved.

In the embodiment, the fixation portion 92 of the support 76 of the outer layer member 71 is thicker than the lead 62 of the capacitor 26. According to this configuration, a high fixing strength between the outer layer member 71 and the board 21 is obtained. Therefore, the shock resistance of the semiconductor storage device 1 can be further improved.

In the embodiment, the support 76 of the outer layer member 71 includes the first support 76a and the second support 76b, each of which is fixed to the board 21. The first support 76a and the second support 76b are separately disposed at positions next to the leads 62 of the capacitor 26. With this configuration, the capacitor 26 is supported by the first support 76a and the second support 76b from both sides of the capacitor 26. Consequently, the shock resistance of the semiconductor storage device 1 can be further improved.

In the embodiment, the support 76 of the outer layer member 71 includes the extending portions 91 and the fixation portions 92. The extending portion 91 includes a part extending to the board 21. The fixation portion 92 is provided at the end of the extending portion 91 and is thinner than the extending portion 91. According to this configuration, the positions of the heat dissipation cap 27 and of the capacitor 26 in height with respect to the board 21 are determined by the step 93 between the extending portion 91 and the fixation portion 92. With this configuration, a jig for adjusting the height of the capacitor 26 with respect to the board 21 is not necessary or such jig can be simplified. Consequently, productivity of the semiconductor storage device 1 can be increased.

Hereinbelow, several modified examples of the first embodiment will be described. The configurations other than that described below for each modified example are the same as those of the first embodiment.

First Modified Example

Figure 6:
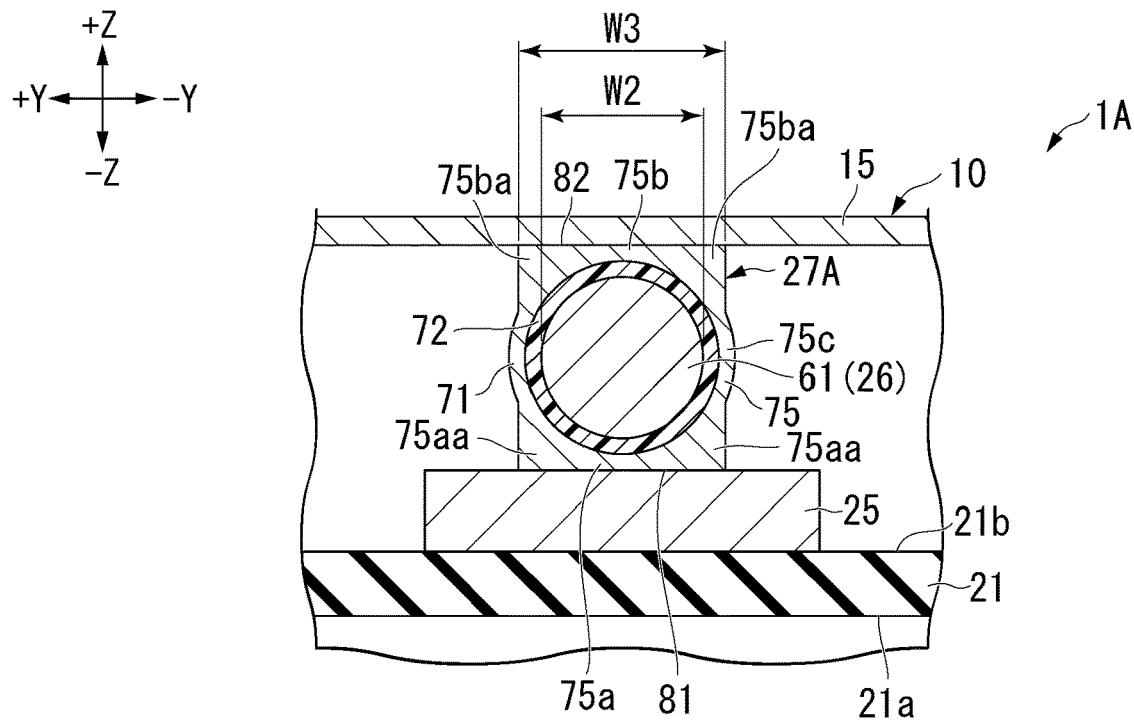
FIG. 6 is a cross-sectional view showing a semiconductor storage device according to a first modified example of the first embodiment.

FIG. 6 is a cross-sectional view showing a semiconductor storage device 1A according to a first modified example. In the first modified example, the second portion 75b of the outer layer member 71 of the ring 75 of a heat dissipation cap 27A includes a pair of projected portions 75ba that protrude toward a radial-outer direction of the ring 75 on both sides of the capacitor body 61 in the Y direction. Therefore, the second portion 75b includes a flat portion 82 facing the inner surface of the second main wall 15 of the housing 10. The flat portion 82 spreads, for example, in parallel to the inner surface of the second main wall 15 of the housing 10. The flat portion 82 is connected to the second main wall 15 of the housing 10 by being directly in contact with the second main wall 15 of the housing 10. In the first modified example, the width W3 (for example, maximum width) of the flat portion 82 in the Y direction is larger than the width W2 (for example, maximum width) of the capacitor 26 in the Y direction. Instead of the aforementioned example, the flat portion 82 may be connected to the second main wall 15 of the housing 10 via the heat transferer HT2 (refer to FIG. 4) sandwiched between the flat portion 82 and the inner surface of the second main wall 15 of the housing 10. The flat portion 82 is an example of "second face."

With this configuration, a heat conductive area between the outer layer member 71 and the second main wall 15 of the housing 10 can be ensured to be large. Accordingly, heat dissipation of the semiconductor storage device 1A can be further improved.

Second Modified Example

Figure 7:
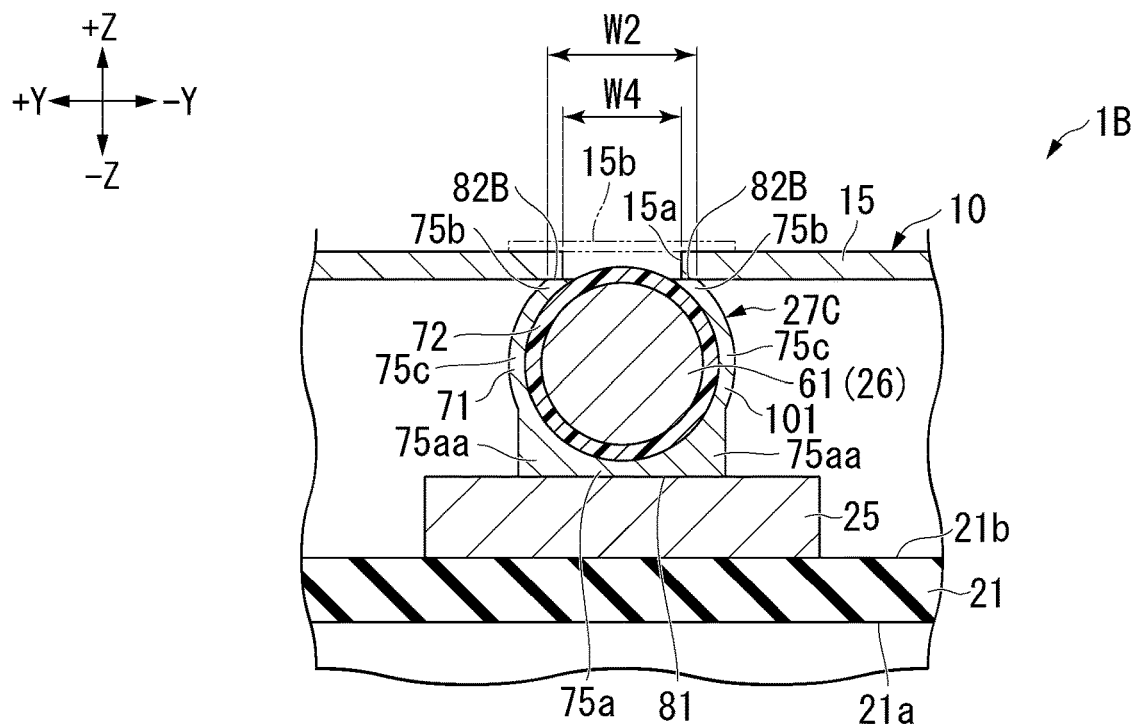
FIG. 7 is a cross-sectional view showing a semiconductor storage device according to a second modified example of the first embodiment.

FIG. 7 is a cross-sectional view showing a semiconductor storage device 1B according to a second modified example. In the second modified example, the second main wall 15 of the housing 10 has an opening 15a at the position corresponding to the capacitor body 61. The width W4 of the opening 15a in the Y direction is smaller than the width W2 of the capacitor 26 in the Y direction. The opening 15a is sealed by, for example, a seal 15b attached to the second main wall 15 from the outside of the housing 10.

In the second modified example, similar to the first embodiment, the inner layer member 72 of a heat dissipation cap 27B is formed in a ring shape. Part of the inner layer member 72 is located inside the opening 15a of the second main wall 15 of the housing 10 in the Z direction.

Instead of the ring 75 described in the first embodiment, the outer layer member 71 includes an arc portion 101 having a part in a circumferential direction thereof which opens at the +Z direction side. The arc portion 101 is formed in an arc shape along the external shape of the inner layer member 72. The arc portion 101 includes the first portion 75a, a pair of the second portions 75b, and a pair of the third portions 75c.

The second portions 75b are separately located at the sides of the opening 15a of the second main wall 15 of the housing 10 in the Y direction. Each of the second portions 75b includes a flat portion 82B facing the inner surface of the second main wall 15 of the housing 10. The flat portion 82B is parallel to the inner surface of the second main wall 15 of the housing 10. The flat portion 82B is connected to the second main wall 15 of the housing 10 by being directly in contact with the inner surface of the second main wall 15 of the housing 10. Instead of this structure, the flat portion 82B may be connected to the second main wall 15 of the housing 10 via the heat transferer HT2 (refer to FIG. 4) sandwiched between the flat portion 82B and the inner surface of the second main wall 15 of the housing 10.

According to this configuration, as part of the inner layer member 72 is located inside the opening 15a of the second main wall 15 of the housing 10, it is possible to reduce the size (for example, thinning of the thickness in the Z direction) of the semiconductor storage device 1B.

Third Modified Example

Figure 8:
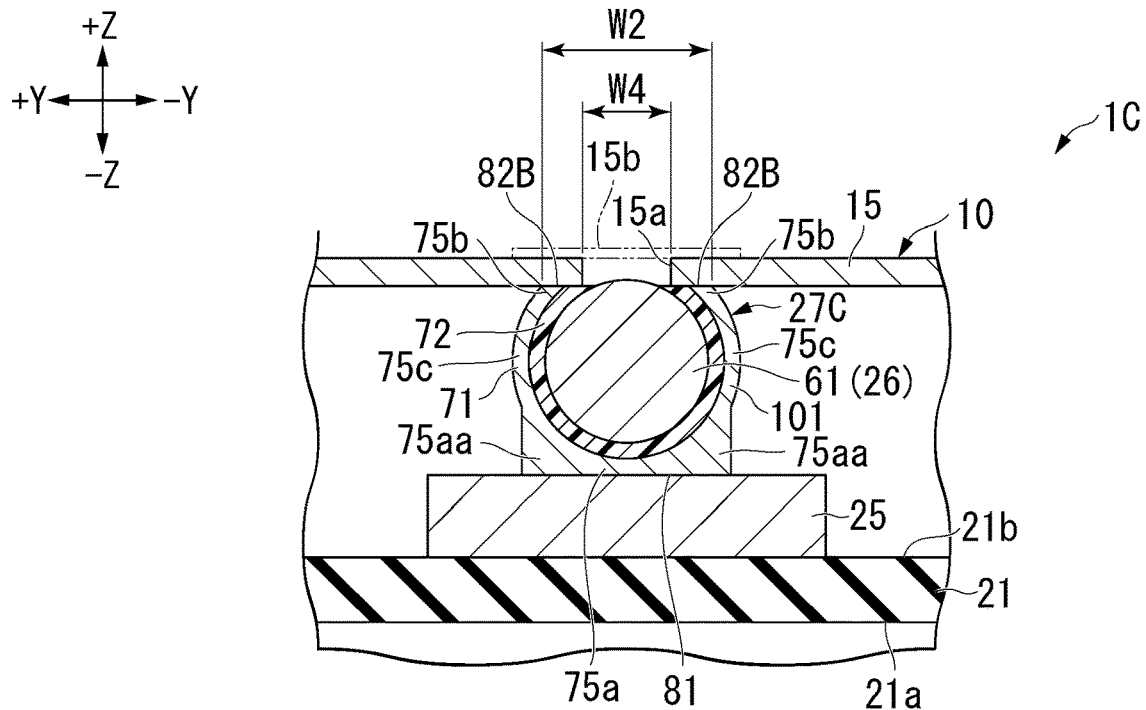
FIG. 8 is a cross-sectional view showing a semiconductor storage device according to a third modified example of the first embodiment.

FIG. 8 is a cross-sectional view showing a semiconductor storage device 1C according to a third modified example. In the third modified example, similar to the second modified example, the outer layer member 71 of a heat dissipation cap 27C includes the arc portion 101 having a part which opens at the +Z direction side. In the third modified example, the inner layer member 72 is also formed in an arc shape having a part in a circumferential direction thereof which opens at the +Z direction side. That is, the inner layer member 72 is formed in an arc shape along the external shape of the capacitor body 61. In the third modified example, part of the capacitor body 61 is located inside the opening 15a of the second main wall 15 of the housing 10 in the Z direction.

With this configuration, as part of the capacitor body 61 is located inside the opening 15a of the second main wall 15 of the housing 10, it is possible to reduce the size (for example, thinning of the thickness in the Z direction) of the semiconductor storage device 1C.

Fourth Modified Example

Figure 9:
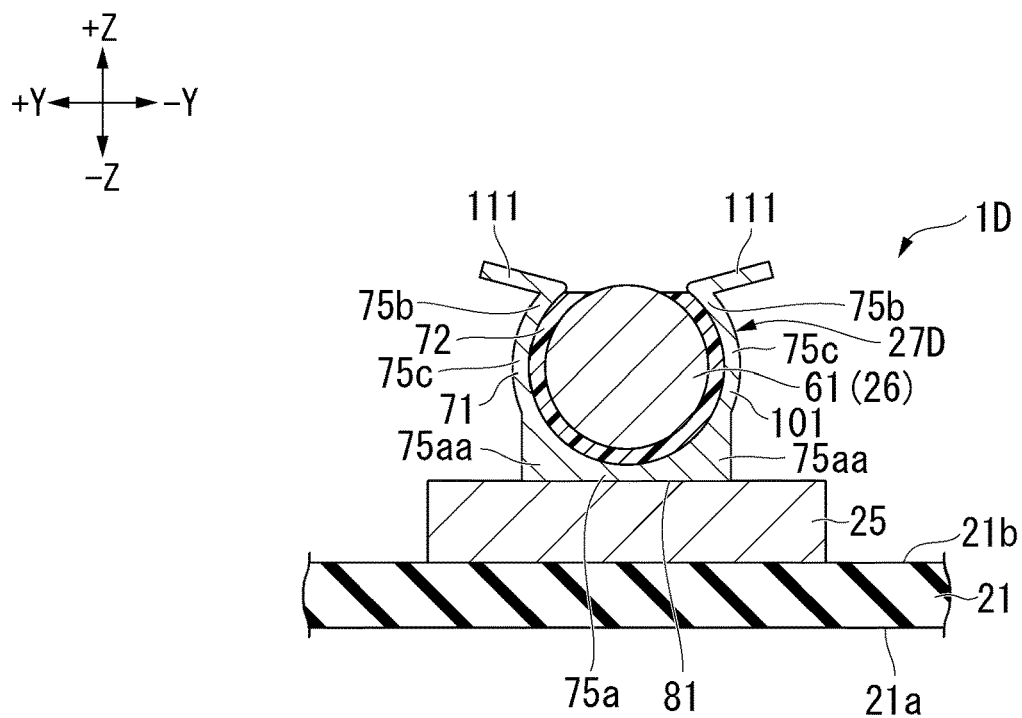
FIG. 9 is a cross-sectional view showing a semiconductor storage device according to a fourth modified example of the first embodiment.
Figure 10:
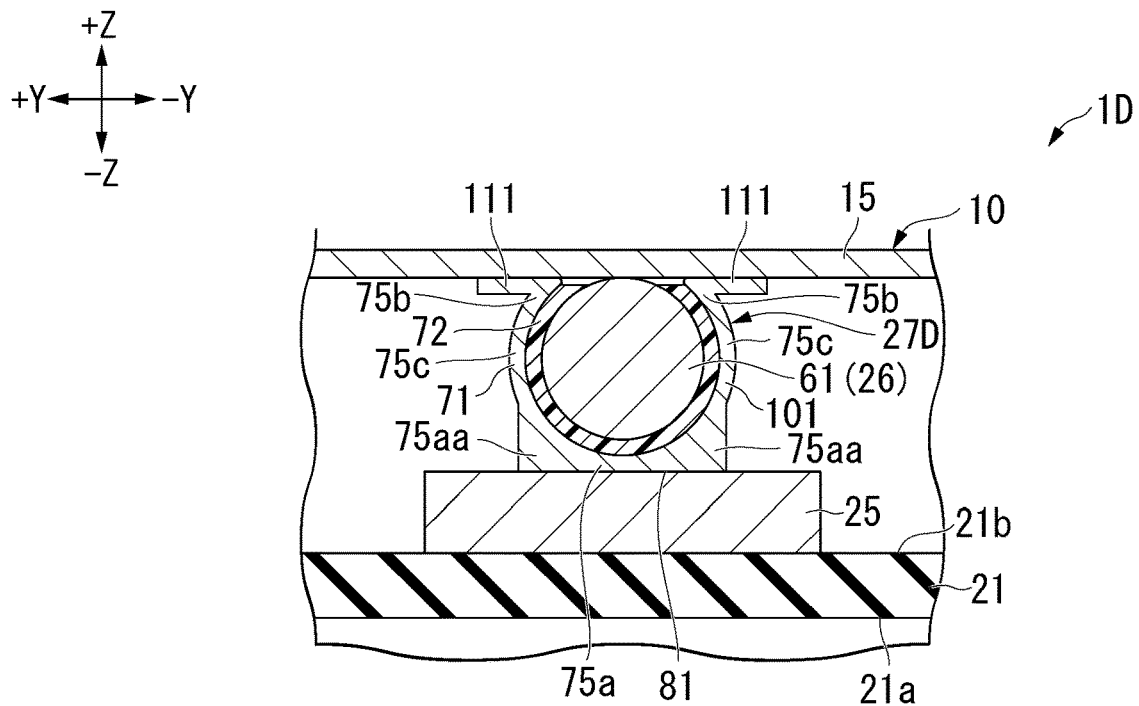
FIG. 10 is a cross-sectional view showing a semiconductor storage device according to the fourth modified example of the first embodiment.

FIGS. 9 and 10 are cross-sectional views showing a semiconductor storage device 1D according to a fourth modified example. FIG. 9 shows a heat dissipation cap 27D before assembled to the housing 10. FIG. 10 shows the heat dissipation cap 27D after assembled to the housing 10.

As shown in FIG. 9, the outer layer member 71 of the heat dissipation cap 27D includes a pair of contact portions 111. The contact portions 111 each extend from the second portion 75b of the arc portion 101 of the outer layer member 71 as a starting point in a direction of separation from the capacitor 26. For example, the contact portions 111 extend obliquely so that the distance from the capacitor 26 increases as the distance from the board 21 increases. The contact portions 111 is formed integrally with the arc portion 101 and is elastically deformable with respect to the second portion 75b. In other words, the contact portions 111 are formed in a plate spring shape with respect to the arc portion 101.

As shown in FIG. 10, when the heat dissipation cap 27D and the housing 10 are assembled, the contact portions 111 of the heat dissipation cap 27D are in contact with the inner surface of the second main wall 15 of the housing 10. For this reason, the contact portions 111 of the heat dissipation cap 27D are pressed by the inner surface of the second main wall 15 of the housing 10 and are elastically deformed to be parallel to the inner surface of the second main wall 15 of the housing 10.

According to this configuration, a connection structure between the outer layer member 71 and the second main wall 15 of the housing 10 can be tightly maintained by the contact portions 111 that are elastically deformable with respect to the arc portion 101. As a result, heat dissipation of the semiconductor storage device 1D can be further improved.

Fifth Modified Example

Figure 11:
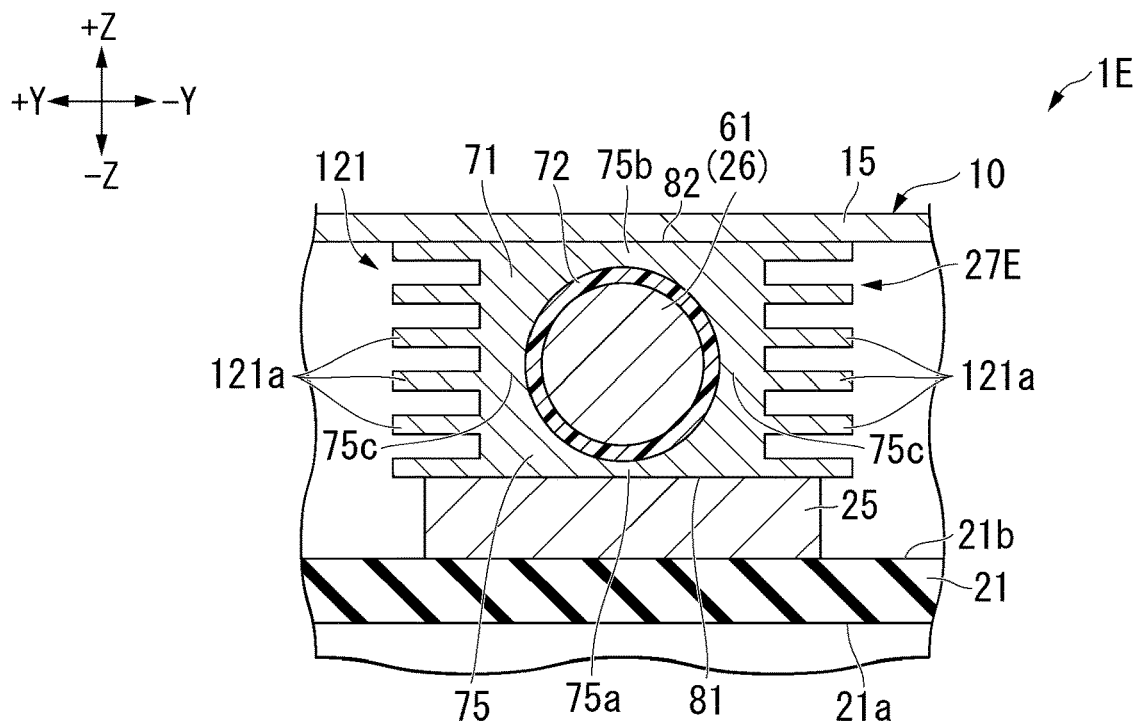
FIG. 11 is a cross-sectional view showing a semiconductor storage device according to a fifth modified example of the first embodiment.

FIG. 11 is a cross-sectional view showing a semiconductor storage device 1E according to a fifth modified example. In the fifth modified example, the third portion 75c of the outer layer member 71 of a heat dissipation cap 27F includes a heatsink 121 having a plurality of fins 121a. The fins 121a are each formed in, for example, a plate shape in the X direction and the Y direction. For example, each of the fins 121a is provided through the entire length of the outer layer member 71 in the X direction. Instead of the plurality of the fins 121a, the heatsink 121 may include a plurality of cylindrical pins.

With this configuration, part of the heat transferred from the NAND 25 to the outer layer member 71 can be dissipated to the internal space of the housing 10 by the heatsink 121. Accordingly, heat dissipation of the semiconductor storage device 1E can be further improved.

Second Embodiment

Next, a second embodiment will be described. The second embodiment is different from the first embodiment in that one heat dissipation cap 27F is provided to a plurality of capacitors 26. The configurations other than that described below are the same as the configurations of the first embodiment.

Figure 12:
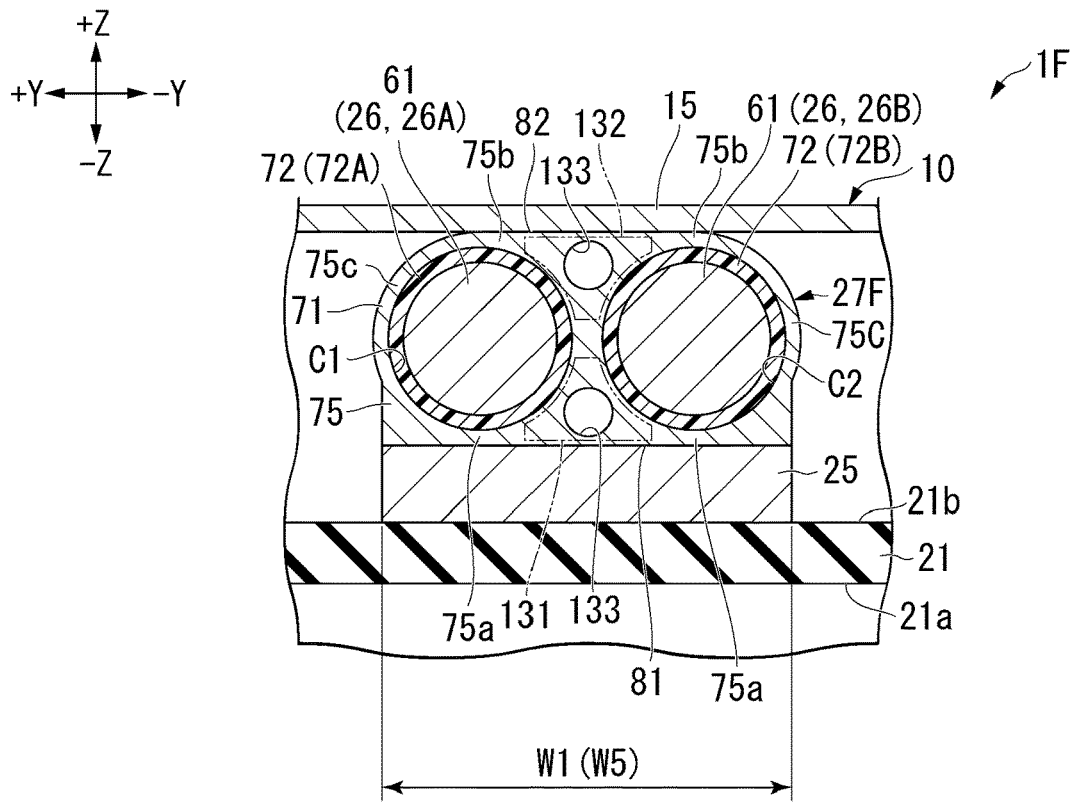
FIG. 12 is a cross-sectional view showing a semiconductor storage device according to a second embodiment.

FIG. 12 is a cross-sectional view showing a semiconductor storage device 1F according to the second embodiment. In the embodiment, one heat dissipation cap 27F is provided with respect to two capacitors 26. Hereinbelow, for convenience of the explanation, the two capacitors 26 are referred to as "first capacitor 26A" and "second capacitor 26B."

As shown in FIG. 12, the first capacitor 26A and the second capacitor 26B are arranged side by side, for example, in the Y direction. At least a portion of the capacitor body 61 of the first capacitor 26A is located between the NAND 25 and the inner surface of the second main wall 15 of the housing 10. At least a portion of the capacitor body 61 of the second capacitor 26B is located between the NAND 25 and the inner surface of the second main wall 15 of the housing 10. The first capacitor 26A is an example of "third electronic device." The second capacitor 26B an example of "fourth electronic device."

In the embodiment, the heat dissipation cap 27F includes one outer layer member 71 and two inner layer members 72. Hereinbelow, the two inner layer members 72 are referred to as "first inner layer member 72A" and "second inner layer member 72B." The first inner layer member 72A is formed in a ring shape that surrounds the peripheral surface of the capacitor body 61 of the first capacitor 26A. The first inner layer member 72A is provided between the outer layer member 71 to be described below and the capacitor body 61 of the first capacitor 26A. On the other hand, the second inner layer member 72B is formed in a ring shape that surrounds the peripheral surface of the capacitor body 61 of the second capacitor 26B. The second inner layer member 72B is provided between the outer layer member 71 to be described below and the capacitor body 61 of the second capacitor 26B.

In the embodiment, the outer layer member 71 collectively surrounds the first inner layer member 72A and the second inner layer member 72B. In other words, the outer layer member 71 includes: a first container C1 that encloses the capacitor body 61 of the first capacitor 26A and the first inner layer member 72A; and a second container C2 that encloses the capacitor body 61 of the second capacitor 26B and the second inner layer member 72B. Furthermore, the outer layer member 71 includes a first flat portion 81 and a second flat portion 82.

The first flat portion 81 is provided at the end of the outer layer member 71 on the −Z direction side and faces the surface of the NAND 25. The first flat portion 81 spreads, for example, in parallel to the surface of the NAND 25. The first flat portion 81 overlaps at least a portion of the capacitor body 61 of the first capacitor 26A in the Z direction and overlaps at least a portion of the capacitor body 61 of the second capacitor 26B in the Z direction. For example, the width W1 of the first flat portion 81 in the Y direction is greater than or equal to half of the width W5 of the NAND 25 in the Y direction. FIG. 12 shows that the width W1 of the first flat portion 81 is the same as the width W5 of the NAND 25.

On the other hand, the second flat portion 82 is provided at the end of the outer layer member 71 on the +Z direction side and faces the inner surface of the second main wall 15 of the housing 10. The second flat portion 82 spreads, for example, in parallel to the inner surface of the second main wall 15 of the housing 10. The second flat portion 82 overlaps at least a portion of the capacitor body 61 of the first capacitor 26A in the Z direction and overlaps at least a portion of the capacitor body 61 of the second capacitor 26B in the Z direction.

In the embodiment, the outer layer member 71 includes a first region 131 and a second region 132. The first region 131 is a region that is located closer to the −Z direction side than the center of the capacitor body 61 and is located between the first container C1 and the second container C2 in the Y direction. In other words, when the heat dissipation cap 27F is viewed from the X direction, the first region 131 is a region surrounded from three directions by the first flat portion 81, the first container C1, and the second container C2. On the other hand, the second region 132 is a region that is located closer to the +Z direction side than the center of the capacitor body 61 and is located between the first container C1 and the second container C2 in the Y direction. In other words, when the heat dissipation cap 27F is viewed from the X direction, the second region 132 is a region surrounded from three directions by the second flat portion 82, the first container C1, and the second container C2.

In the embodiment, each of the first region 131 and the second region 132 includes a vent hole 133. The vent hole 133 penetrates through the heat dissipation cap 27F in the X direction. That is, the vent hole 133 is provided along the direction of an air flow in the housing 10. The air that has flowed into the inside of the housing 10 from the outside through the first vent hole 16a (or the second vent hole 17a) of the housing 10 flows into the vent hole 133.

Figure 13:
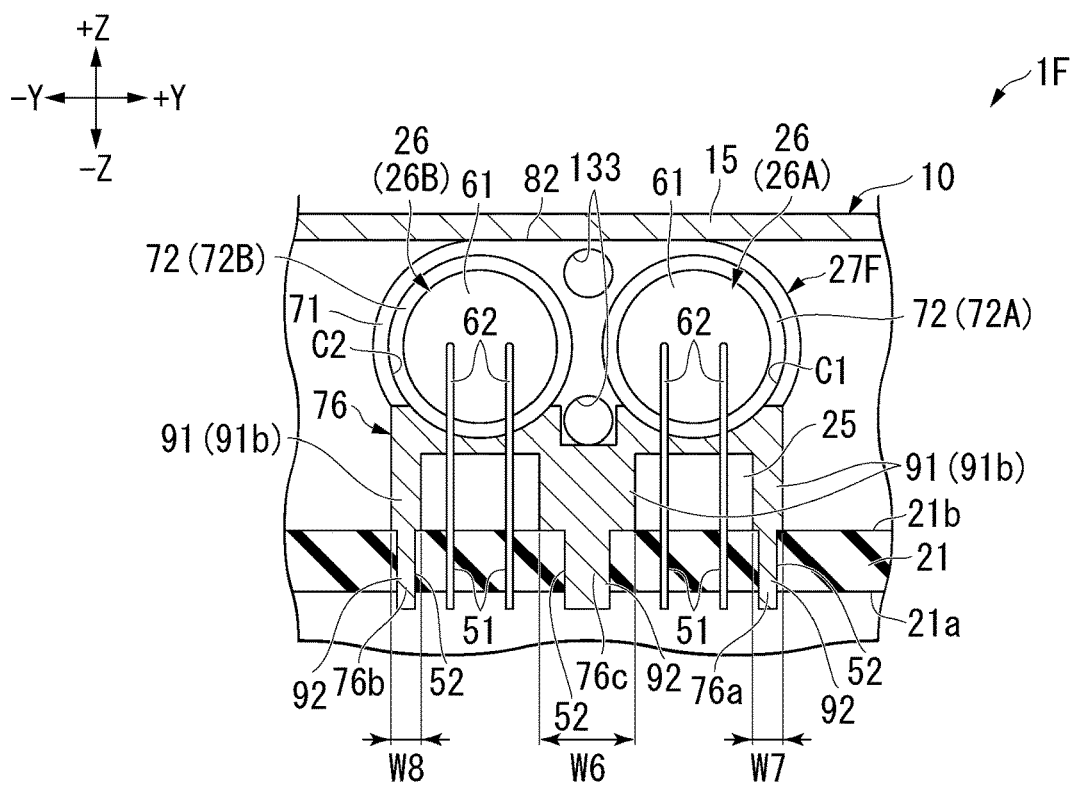
FIG. 13 is a cross-sectional view showing the semiconductor storage device according to the second embodiment when viewed from another direction.

FIG. 13 is a cross-sectional view showing the semiconductor storage device 1F according to the second embodiment when viewed from another direction. In FIG. 13, for convenience of the explanation, the solder S that fixes the leads 62 and the heat dissipation cap 27F onto the board 21 is omitted. In the embodiment, the outer layer member 71 includes three supports 76. Hereinbelow, the three supports 76 are referred to as "the first support 76a", "the second support 76b", and "third support 76c." Similar to the first support 76a and the second support 76b according to the first embodiment, each of the first support 76a, the second support 76b, and the third support 76c includes the extending portion 91 and the fixation portion 92.

The first support 76a is provided at the +Y direction side with respect to the lead 62 of the first capacitor 26A. The second support 76b is provided at the −Y direction side with respect to the lead 62 of the second capacitor 26B. The third support 76c is provided between the lead 62 of the first capacitor 26A and the lead 62 of the second capacitor 26B. For example, the width W6 (for example, the width of the extending portion 91) of the third support 76c in the Y direction is larger than the width W7 (for example, the width of the extending portion 91) of the first support 76a in the Y direction, and is larger than the width W8 (for example, the width of the extending portion 91) of the second support 76b in the Y direction.

According to the configuration described above, similar to the first embodiment, heat dissipation of the semiconductor storage device 1F can be improved. In the embodiment, the outer layer member 71 of the heat dissipation cap 27F includes: the first container C1 that encloses at least a portion of the first capacitor 26A; and the second container C2 that encloses at least a portion of the second capacitor 26B. With this configuration, the heat dissipation cap 27F having a relatively large size to accommodate the plurality of the capacitors 26 can receive the heat of the NAND 25. As a result, heat dissipation of the semiconductor storage device 1F can be further improved.

Moreover, according to the heat dissipation cap 27F having a relatively large size, it is easy to design the center support (e.g., the third support 76c) located between the two containers C1 and C2 to be thick. When the center support (e.g., the third support 76c) is formed to be thick, it is easy to improve a vibration resistance and a shock resistance of the semiconductor storage device 1F.

In the embodiment, the outer layer member 71 of the heat dissipation cap 27F includes the vent hole 133 at the first region 131 (or the second region 132) between the first container C1 and the second container C2 in the Y direction. According to this configuration, as air flows into the vent hole 133, it is possible to effectively dissipate part of the heat received by the outer layer member 71 from the NAND 25. As a result, heat dissipation of the semiconductor storage device 1F can be further improved.

Hereinafter, a modified example of the second embodiment will be described. The configurations other than that described below in the modified example are the same as those of the second embodiment.

Modified Example

Figure 14:
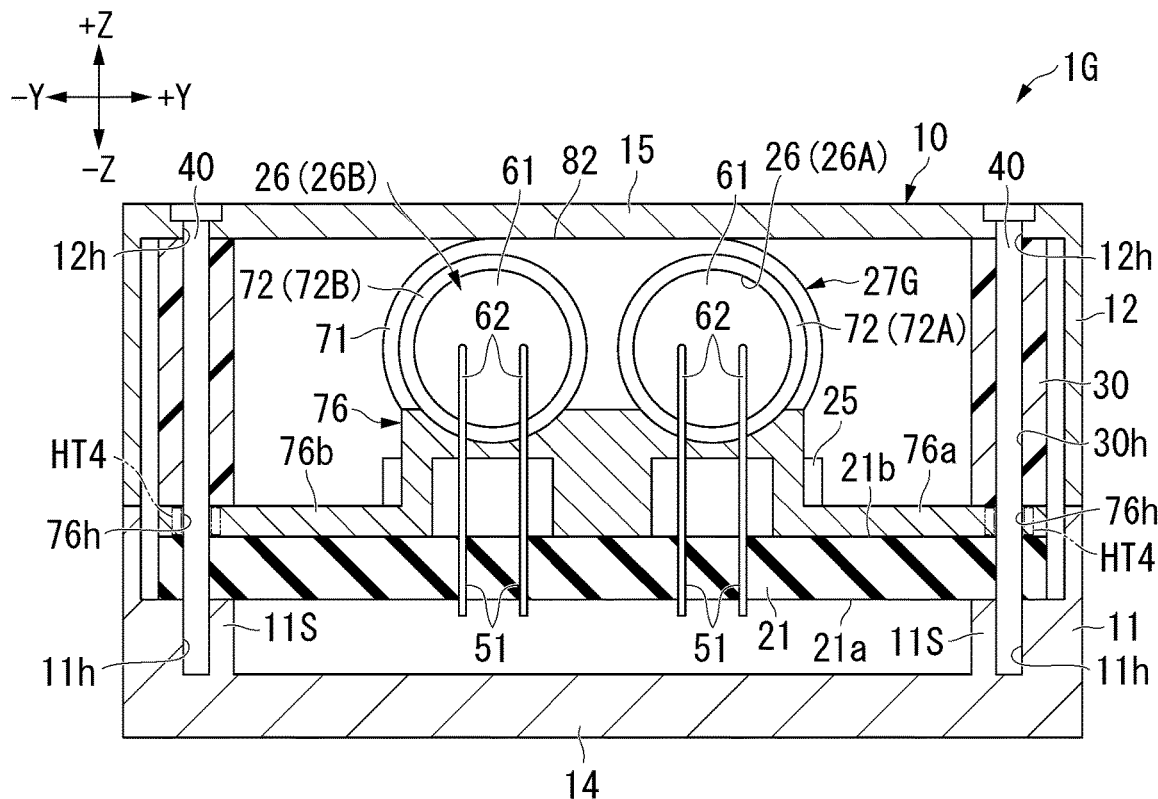
FIG. 14 is a cross-sectional view showing a semiconductor storage device according to a modified example of the second embodiment.

FIG. 14 is a cross-sectional view showing a semiconductor storage device 1G according to a modified example. For convenience of the explanation. FIG. 14 schematically shows the simplified configuration of the semiconductor storage device 1G. Furthermore, in FIG. 14, the solder S that fixes the leads 62 to the board 21 is omitted.

In the modified example, the support 76 of a heat dissipation cap 27G includes the first support 76a and the second support 76b. Each of the first support 76a and the second support 76b extends toward the fixing member 40 along the second surface 21b of the board 21 and is connected to the fixing member 40. For example, each of the first support 76a and the second support 76b includes an insertion hole 76h through which the fixing member 40 passes. Each of the first support 76a and the second support 76b is fixed to the housing 10 and the board 21 by the fixing member 40. As described above, the fixing member 40 is a fitting member such as a screw or a pin and is made of, for example, metal. Each of the first support 76a and the second support 76b is connected to the housing 10 by the fixing member 40. Note that, a heat transferer HT4 may be provided between the first support 76a and the fixing member 40, and between the second support 76b and the fixing member 40. That is, each of the first support 76a and the second support 76b may be connected to the fixing member 40 via the heat transferer HT4. The heat transferer HT4 is an example of "fourth heat transferer."

With this configuration, part of the heat received by the outer layer member 71 of the heat dissipation cap 27G from the NAND 25 is transferred from the first support 76a and the second support 76b to the housing 10 through the fixing member 40 and is dissipated from the surface of the housing 10 to the outside of the housing 10. Therefore, heat dissipation of the semiconductor storage device 1G can be improved. Moreover, in the aforementioned configuration, unlike the first embodiment, it is not necessary to fix the first support 76a and the second support 76b to the board 21 using the solder S. Consequently, productivity of the semiconductor storage device 1G can be increased.

Third Embodiment

Next, a third embodiment will be described. The third embodiment is different from the first embodiment in that a heat dissipation cap 27H is connected to the board 21 instead of to the NAND 25. The configurations other than that described below are the same as the configurations of the first embodiment.

Figure 15:
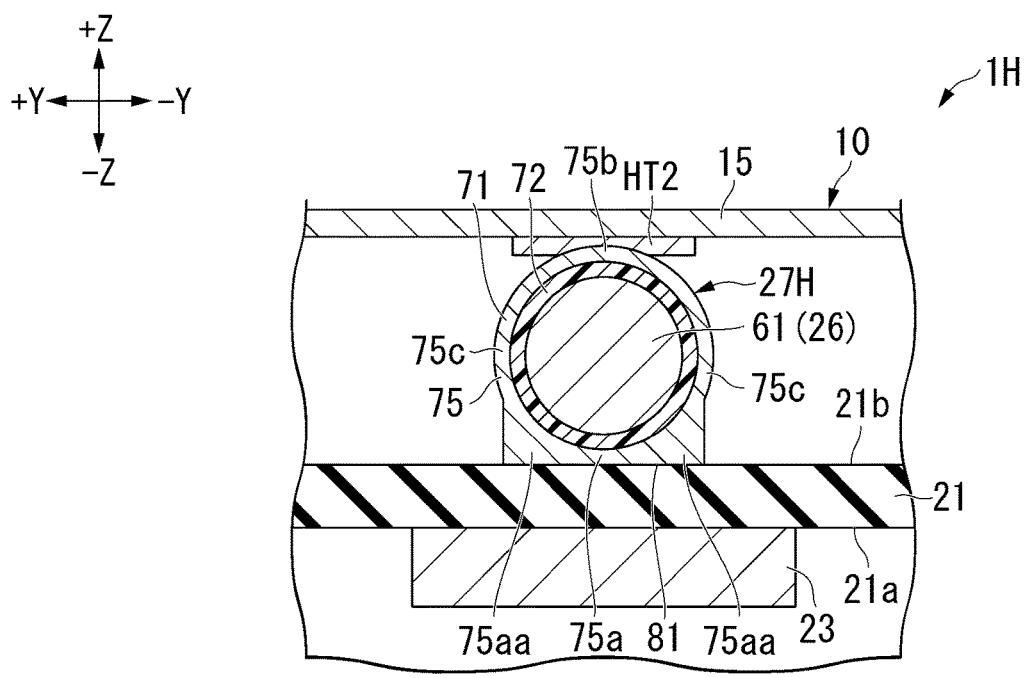
FIG. 15 is a cross-sectional view showing a semiconductor storage device according to a third embodiment.

FIG. 15 is a cross-sectional view showing a semiconductor storage device 1H according to the third embodiment. In the embodiment, the controller 23 is mounted on the first surface 21a of the board 21. The controller 23 is an example of "first electronic device" and also is an example of "heat generator." However, "first electronic device" and "heat generator" are not limited to the controller 23 but may be the DRAMs 24, the NAND 25, or another device.

In the embodiment, at least a portion of the capacitor body 61 overlaps the board 21 in the Z direction. In the embodiment, at least a portion of the capacitor body 61 is located between the board 21 and the inner surface of the second main wall 15 of the housing 10 in the Z direction. Similar to the first embodiment, to reduce the height of the capacitor 26 when mounted on the board 21, the capacitor 26 is mounted on the board 21 such that the leads 62 are bent and the capacitor body 61 extends in the X direction.

In the embodiment, on the second surface 21b of the board 21, at least a portion of the outer layer member 71 of the heat dissipation cap 27H is disposed on a region that overlaps the controller 23 in the Z direction. The outer layer member 71 includes the first portion 75a located between the board 21 and the capacitor body 61 in the Z direction. The first portion 75a is a heat receiver that is connected to the board 21 and receives heat generated from the controller 23 through the board 21. In the embodiment, the first portion 75a is connected to the board 21 by being directly in contact with the surface of the board 21. Instead of this structure, the first portion 75a may be connected to the board 21 via the heat transferer HT1 sandwiched between the first portion 75a and the board 21 (refer to FIG. 3).

According to the configuration described above, similar to the first embodiment, heat dissipation of the semiconductor storage device 1H can be improved. For example, in the configuration according to the embodiment, the heat dissipation cap 27H can receive heat generated from a heat generator located at the back side of the board 21 through the board 21. For this reason, heat dissipation of the semiconductor storage device 1H can be improved.

While some embodiments and modified examples have been described above, the embodiments and the modified examples are not limited to the above examples. For example, the embodiments and the modified examples described above may be optionally combined to each other.

The heat dissipation cap 27 is connected to the NAND 25 in the above-mentioned first embodiment, and the heat dissipation cap 27H is connected to the board 21 in the above-mentioned third embodiment. Instead of such configuration, the heat dissipation cap may be connected to both the NAND 25 and the board 21.

In the aforementioned first embodiment, the support 76 fixed to the board 21 is provided at part of the outer layer member 71. Instead of this structure, the support 76 may be provided at part of the inner layer member 72 or may be provided at both the outer layer member 71 and the inner layer member 72. The heat dissipation cap may have a structure enclosing not only one or two capacitors 26 but also three or more capacitors 26. In the above-described embodiments, for example, "semiconductor memory device" is a NAND flash memory. However, "semiconductor memory device" is not limited to the NAND flash memory but may be a Magnetoresistive Random Access Memory (MRAM), a Resistive random-access memory, or a storage device including other type memory. That is, "semiconductor memory device" is not limited to a memory device that stores data depending on an electric charge accumulation state but may be a memory device that stores data depending on a magnetic state, a resistive state, or the like. All of such semiconductor memory devices each may be an example of "first electronic device" and an example of "heat generator."

According to at least one of the embodiments described above, the heat dissipator includes a first member, a second member, and a support. The first member includes a container and has a first thermal conductivity. The second member has a second thermal conductivity being smaller than the first thermal conductivity. The support extends from the first member and is configured to be connected to a board. The board is configured to mount an electronic device. The container is configured to accommodate the electronic device and the second member. The second member includes a portion located between the electronic device and the first member if the electronic device is inserted into the container. The support includes a first portion and a second portion. The second portion extends in a first direction different from a second direction. The second direction is a direction of the electronic component being insertable into the container. With this configuration, heat dissipation of the semiconductor storage device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a board;
a first electronic device mounted on the board;
at least one second electronic device mounted on the board, at least a portion of the second electronic device overlapping at least one of the board and the first electronic device in a first direction that is a thickness direction of the board; and
a heat dissipator including:
a first member that includes a first portion located between the first electronic device and the second electronic device in the first direction, the first portion being connected to the first electronic device, directly or via a first heat transferrer; and a second member that includes a portion located between the first member and the second electronic device in the first direction, the second member being smaller in coefficient of thermal conductivity than the first member.

2. The semiconductor storage device according to claim 1, wherein the first electronic device is a non-volatile memory or a controller configured to control the non-volatile memory.

3. The semiconductor storage device according to claim 1, wherein
the first portion includes a first face, and
the first face is connected to the first electronic device, directly or via the first heat transferrer.

4. The semiconductor storage device according to claim 1, further comprising:
a housing in which the board is housed, wherein
the first member further includes a second portion being different from the first portion, and
the second portion of the first member is connected to the housing, directly or via a second heat transferrer.

5. The semiconductor storage device according to claim 1, wherein the first member includes a first heat dissipating member connected to the board, directly or via a third heat transferrer, on a region at which the first member does not overlap the first electronic device in the first direction.

6. The semiconductor storage device according to claim 1, wherein
the second electronic device includes:
a component body; and
a lead protruding from the component body to a direction being different from the first direction, the lead being bent to be directed to the board and connected to the board, and
at least one of the first member and the second member includes a support fixed to the board.

7. The semiconductor storage device according to claim 1, wherein
the second electronic device is a capacitor,
the capacitor includes a component body having a cylindrical external form,
at least a portion of the second member is formed in a shape along a circle of the cylindrical external form of the component body, and
at least a portion of the first member is formed in a shape along an external form of the second member.

8. The semiconductor storage device according to claim 1, wherein
the at least one second electronic device comprises a plurality of second electronic devices, one of the plurality of second electronic devices being located next to another one of the plurality of second electronic devices in a second direction orthogonal to the first direction,
the first member includes a first container and a second container,
the first container is configured to contain at least a portion of the one of the plurality of second electronic devices, and
the second container is configured to contain at least a portion of said another one of the plurality of second electronic devices.

9. The semiconductor storage device according to claim 3, wherein
the second electronic device includes a columnar portion, and
a width of the first face is larger than a width of the second electronic device in a direction orthogonal to a longitudinal direction of the columnar portion.

10. The semiconductor storage device according to claim 4, wherein
the second portion of the first member includes a second face, and
the second face is connected to the housing, directly or via the second heat transferrer.

11. The semiconductor storage device according to claim 4, further comprising:
a fixing member fixing the housing and the board,
wherein the first member includes a first heat dissipating member connected to the fixing member, directly or via a fourth heat transferrer, on a region of the board at which the first member does not overlap the first electronic device in the first direction.

12. The semiconductor storage device according to claim 5, wherein the first heat dissipating member is fixed to the board by solder.

13. The semiconductor storage device according to claim 6, wherein the support includes a first support and a second, each of which is fixed to the board.

14. The semiconductor storage device according to claim 8, wherein the first member has a vent hole passing through a third direction orthogonal to the first direction and the second direction and being disposed on a region between the first container and the second container.

15. The semiconductor storage device according to claim 12, wherein
the board has a first fixation hole, and
at least a portion of the first heat dissipating member is inserted into the first fixation hole.

16. The semiconductor storage device according to claim 12, wherein
the board includes a ground layer, and
the first heat dissipating member is connected to the ground layer.

17. The semiconductor storage device according to claim 13, wherein
the first support includes a first fixation portion,
the second support includes a second fixation portion,
the board includes a plurality of first fixation holes and a plurality of second fixation holes, the plurality of second fixation holes being disposed between two of the plurality of first fixation holes in a direction orthogonal to the first direction,
the first fixation portion is inserted into one of the plurality of first fixation holes,
the second fixation portion is inserted into another one of the plurality of first fixation holes, and
the lead is inserted into one of the plurality of second fixation holes.

18. A semiconductor storage device comprising:
a printed-wiring board;
a semiconductor memory device mounted on the printed-wiring board;
at least one capacitor mounted on the printed-wiring board, at least a portion of the capacitor overlapping at least one of the printed-wiring board and the semiconductor memory device in a first direction that is a thickness direction of the printed-wiring board; and a heat dissipater including:
- a first member that includes a first portion located between the semiconductor memory device and the capacitor in the first direction, the first portion being connected to the semiconductor memory device, directly or via a first heat transferrer; and
- a second member that includes a portion located between the first member and the capacitor in the first direction, the second member being smaller in coefficient of thermal conductivity than the first member.

19. A heat dissipator comprising:

a first member including a container and having a first thermal conductivity;

a second member having a second thermal conductivity being smaller than the first thermal conductivity; and a support extending from the first member and being configured to be connected to a board, the board being configured to mount an electronic device, the support and the first member each being a part of a single member; wherein the container is configured to accommodate the electronic device and the second member, the second member includes a portion located between the electronic device and the first member so that the electronic device is inserted into the container, the support includes a first portion and a second portion, the second portion extending in a first direction different from a second direction, the second direction being a direction of the electronic device being insertable into the container, and the first portion is connected to the electronic device directly, or via a first heat transfer.

20. The heat dissipator according to claim 19, wherein the electronic device is formed in a cylindrical shape, the first member has a first curved portion along the cylindrical shape of the electronic device, the first curved portion faces an outer surface of the second member, the second member has a second curved portion along the cylindrical shape of the electronic device, and the second curved portion faces an outer surface of the electronic device.

21. The heat dissipator according to claim 19, wherein the first member has a first opening portion, the first opening portion opens in the second direction, the second member has a second opening portion, the second opening portion opens in the second direction, the electronic device is configured to be inserted into the second member through the second opening portion, and the electronic device and the second member are configured to be inserted into the container through the first opening portion.

22. The heat dissipator according to claim 19, wherein the second member is configured to inhibit heat transfer from the first member.

* * * * *